United States Patent
Otani et al.

(10) Patent No.: US 6,967,407 B2
(45) Date of Patent: Nov. 22, 2005

(54) SEMICONDUCTOR DEVICE AND METHOD OF MANUFACTURING THE SEMICONDUCTOR DEVICE

(75) Inventors: Miharu Otani, Yokohama (JP); Jun Tanaka, Yokohama (JP); Katsuhiko Hotta, Kodaira (JP); Yasumichi Suzuki, Kodaira (JP); Takashi Inoue, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 66 days.

(21) Appl. No.: 10/333,838
(22) PCT Filed: Jun. 25, 2001
(86) PCT No.: PCT/JP01/05410
§ 371 (c)(1), (2), (4) Date: May 27, 2003
(87) PCT Pub. No.: WO02/21587
PCT Pub. Date: Mar. 14, 2002

(65) Prior Publication Data
US 2003/0193090 A1 Oct. 16, 2003

(30) Foreign Application Priority Data
Sep. 6, 2000 (JP) .......................... 2000-274985

(51) Int. Cl.$^7$ ................ H01L 23/48; H01L 21/4763
(52) U.S. Cl. ................ 257/759; 257/760; 438/623; 438/624
(58) Field of Search ................. 257/758, 759, 257/760; 438/622–624

(56) References Cited

U.S. PATENT DOCUMENTS 5,629,557 A   5/1997   Yamaha
6,333,558 B1 * 12/2001 Hasegawa ................. 257/759
6,420,261 B2 *  7/2002 Kudo ........................ 438/633
6,528,145 B1 *  3/2003 Berger et al. ............. 428/156

FOREIGN PATENT DOCUMENTS

| JP | 60-34022 | 2/1985 | | |
| JP | 62-293239 | 12/1987 | | |
| JP | 2-113555 | 4/1990 | | |
| JP | 6-177242 | 6/1994 | | |
| JP | 9-232428 | 9/1997 | | |
| JP | 09-232428 | * 9/1997 | ......... | H01L/21/768 |
| JP | 10-112503 | * 4/1998 | ......... | H01L/21/768 |
| JP | 10-172927 | 6/1998 | | |
| JP | 10-261624 | 9/1998 | | |

OTHER PUBLICATIONS

IEEE International Electron Devices Meeting Technical Digest, 1999, pp. 623–626.

* cited by examiner

Primary Examiner—T. N. Quach
(74) Attorney, Agent, or Firm—Mattingly, Stanger, Malur & Brundidge, P.C.

(57) ABSTRACT

A semiconductor device capable of high speed operation with a substantially small interlayer capacitance is produced by steps of using an insulating film comprising an organic insulating film and an insulating film composed of an organometallic polymer material as an interlayer insulating film formed by coating, patterning the insulating film in a semi-thermosetting state, etching the organic insulating film as the lower layer by means of the organometallic polymer as a mask, using a plasma gas containing oxygen as the main component, and then conducting ultimate baking treatment of these insulating films.

14 Claims, 16 Drawing Sheets

CENTRAL PORTION    END PORTION

CENTRAL PORTION     END PORTION

SEMICONDUCTOR DEVICE AND METHOD OF MANUFACTURING THE SEMICONDUCTOR DEVICE

TECHNICAL FIELD

The present invention relates to a semiconductor device with an organic insulating film having a low dielectric constant in an interlayer insulating film and a process for producing the same.

BACKGROUND ART

With increasing integration density of semiconductor devices and chip size reduction, formation of finer wirings or a narrower pitch in a multilayer structure is now in progress. Consequently, the time of delay in propagation of signals through wirings, i.e. delay in signal propagation through wirings, becomes longer, causing a serious problem in the use of semiconductor device-mounted electronic appliances.

Generally, the speed of signal propagation through wirings depends on a product (RC) of wiring resistance (R) by interwiring capacitance (C), and thus it is necessary for improving the delay in signal propagation through wirings to lower the wiring resistance and decrease the interwiring capacitance, i.e. to make the dielectric constant of an interlayer insulating film lower.

Heretofore, inorganic materials have been used for the interlayer insulating film in the semiconductor device, for example, $SiO_2$ film (relative dielectric constant: approximately 4.0), SiN film (relative dielectric constant: approximately 7.0) or the like, each formed by CVD (chemical vapor deposition) process. Recently, a SiOF film (relative dielectric constant: approximately 3.7) have been used very often as a low-dielectric constant material film formed by said conventional process.

However, owing to the still relatively high dielectric constant, the $SiO_2$ film is not so effective for lowering the interlayer capacitance, when used as an interlayer insulating film, and thus materials of much lower dielectric constant are required for the next or further generation semiconductor devices.

Organic materials are now extensively studied as materials for interlayer insulating films having a relative dielectric constant of not more than 3.0, and such polymer materials as polyimide, polyparaxylylene, polyarylene ether, polyarylene, polybenzocyclobutene, polynaphthalene, etc., all of which are hydrocarbon-based resins, are known as materials for interlayer insulating film. Carbon atoms contained in these materials contribute to a decrease in the film density, while lower polarizability of their molecules (monomers) per se contributes to a lower dielectric constant. Introduction of imido bonds or aromatic rings thereto assures the heat resistance to some extent.

In the patterning of interlayer insulating films including organic insulating films by means of a photo-resist, their etching characteristics largely depend on the film compositions. Said low-dielectric constant films contain carbon, hydrogen, etc. which are common elements to those of the photo-resist, and thus the etching characteristics of these films and the photo-resist show a similar tendency. That is, in the patterning of said low-dielectric constant films through such a photo-resist, it is known that the low-dielectric constant films are also oxidized during the step of removing the resist (by oxygen plasma treatment, etc.) after the patterning step, resulting in reduction in the film thickness or degradation of film quality.

To solve these problems, JP-A-10-112503 discloses the so called "hard mask" process comprising transferring a resist pattern onto an inorganic material such as a $SiO_2$ film, etc. at first and then forming a via hole or trench pattern in a low-dielectric constant film by means of the inorganic material as a mask. Furthermore, a dual hard mask (using hard masks in a double layer) is disclosed as an improved hard mask process in IEEE International Electron Devices Meeting Technical Digest, p.p. 623–626 (1999).

One prior art example of a process for producing a semiconductor device is shown in FIG. 1. At first, organic low-dielectric constant material 2 is applied to silicon substrate 1 [FIG. 1(a)], and thermoset by stepwise heating up to cure baking at about 400° C. to form a film [FIG. 1(b)]. Then, silicon oxide film 3 is formed on organic low-dielectric constant film 2, for example, by known CVD process [FIG. 1(c)]. Then, a photo-resist film is formed on silicon oxide film 3 [FIG. 1(d)], and resist pattern 4 for forming a wiring pattern is formed on silicon oxide film 3 by known photolithography [FIG. 1(e)]. Then, silicon oxide film 3 is etched by means of resist pattern 4 as a mask, using an etching gas containing, e.g. $CF_4$ as the main component [FIG. 1(f)]. Still further, organic low-dielectric constant film 2 is etched by means of resist pattern 4 and silicon oxide film 3 as a mask, using an oxygen-containing etching gas, where resist pattern 4 is also removed at the same time [FIG. 1(g)], thereby forming opening 5 having a wiring pattern configuration. Then, the pattern inside is washed with, e.g. a neutral stripping solution, followed by drying and baking to form a wiring pattern [FIG. 1(h)].

However, said prior art process has serious problems such as complication of process steps as comared with a process using an ordinary resin resist as a mask and residues of hard mask material comprising a silicon oxide film having a high relative dielectric constant being left as part of the interlayer insulating material, resulting in an inevitable increase in the effective relative dielectric constant as compared with the case of using only a low-dielectric constant film.

DISCLOSURE OF INVENTION

On the basis of the aforementioned technical background, the present invention proposes to solve the above-mentioned problems by using an organic insulating film in an interlayer insulating film and to simplify the process steps at the same time. Effective relative dielectric constant of an interlayer insulating film can be lowered thereby, and consequently delay in the signal propagation through wirings can be extremely shortened, and also power consumption reduction and high speed operation of semiconductor devices can be attained.

The present invention provides a semiconductor device comprising a wiring layer and an interlayer insulating film layer, characterized in that the interlayer insulating film layer is at least one of layers each comprising a first insulating layer composed of an organic insulating film as a lower layer and a second insulating layer composed of an organometallic polymer material laid thereon as an upper layer, or at least one layer of the second insulating layer composed only of the organometallic polymer material.

The present invention further provides an electronic circuit device comprising a wiring layer and an interlayer insulating film layer, characterized in that the interlayer insulating film layer is at least one of layers each comprising a first insulating layer composed of an organic insulating film as a lower layer and a second insulating layer composed of organometallic polymer material laid thereon as an upper layer.

The present invention still further provides a process for producing a semiconductor device, characterized by comprising a step of applying an organic insulating film material to a substrate, thereby forming a first insulating layer, a step of applying an organometallic polymer material to the first insulating layer, thereby forming a second insulating layer, a step of forming an opening-forming resist pattern on the second insulating layer, a step of forming an opening in the second insulating layer by means of the resist pattern as a mask, a step of forming an opening in the first insulating layer by means of the resist and the second insulating layer by dry etching, while removing the resist, and a step of baking the first insulating layer and the second insulating layer.

The present invention still further provides a process for producing a semiconductor device, characterized by comprising a step of applying an organic insulating film material to a substrate, thereby forming a first insulating layer, a step of applying an organometallic polymer material to the first insulating layer, thereby forming a second insulating layer, a step of forming an opening-forming resist pattern on the second insulating layer and forming an opening in the second insulating layer, a step of forming an opening in the first insulating layer by dry etching, while removing the resist, and a step of baking the first insulating layer and the second insulating layer.

The present invention still further provides a process for producing a semiconductor device, characterized by comprising a step of applying an organic insulating film material to a substrate, thereby forming a first insulating layer, a step of applying an organometallic polymer material to the first insulating layer, thereby forming a second insulating layer, a step of forming an opening in the second insulating layer, a step of forming an opening in the first insulating layer by means of the second insulating layer as a mask by dry etching, and a step of baking the first insulating layer and the second insulating layer.

The present invention still further provides a semiconductor memory device comprising a memory device-containing semiconductor substrate, an interlayer insulating layer laid on the semiconductor substrate, an upper wiring layer, and a wiring material, provided with a partition wall surrounding device peripheral region to prevent moisture absorption and permeation through the peripheral region (the partition wall will be hereinafter referred to as "guard ring"), characterized in that the interlayer insulating layer comprises an insulating film composed of an organic insulating film as a lower layer and an insulating film composed of a ladder silicone-based polymer material laid thereon as an upper layer, one end of the guard ring provided at the outermost peripheral region of the memory device is connected to the upper wiring layer and the other end is embedded in the semiconductor substrate.

The present invention still further provides a semiconductor device comprising an MOS transistor-contained semiconductor substrate, and a BPSG layer formed on the semiconductor substrate, a wiring layer, an insulating interlayer and a protective layer, successively formed on the semiconductor substrate, characterized in that an electro-conductive plug provided through the BPSG layer and the insulating interlayer is connected to the semiconductor substrate through the wiring layer, the insulating interlayer comprises an insulating layer composed of an organic insulating film as a lower layer and an insulating layer composed of a ladder silicone-based polymer material laid thereon as an upper layer, and the protective film is provided so as to enclose the peripheral edges of the BPSG layer and the insulating interlayer.

BRIEF DESCRIPTION OF DRAWINGS

FIGS. 1(a)–1(h) show process steps for producing the conventional semiconductor device.

FIGS. 2(a)–2(f) show process steps for producing a semiconductor device according to Example 1.

FIGS. 3(a)–3(e) show process steps for producing a semiconductor device according to Example 2.

FIGS. 4(a)–4(e) show process steps for producing a semiconductor device according to Example 3.

FIGS. 8(a)–8(g) show process steps for producing a semiconductor device according to Example 7.

FIGS. 9(a)–9(j) show process steps for producing a semiconductor device in a multilayered structure according to Example 8.

FIGS. 10(a)–10(e) show process steps for producing a semiconductor device in a multilayered structure according to Example 9.

FIGS. 11(a)–11(d) show process steps for producing a semiconductor device in a multilayered structure according to Example 10.

In FIGS. 1 to 20, reference numerals have the following meanings:

Figure 1:
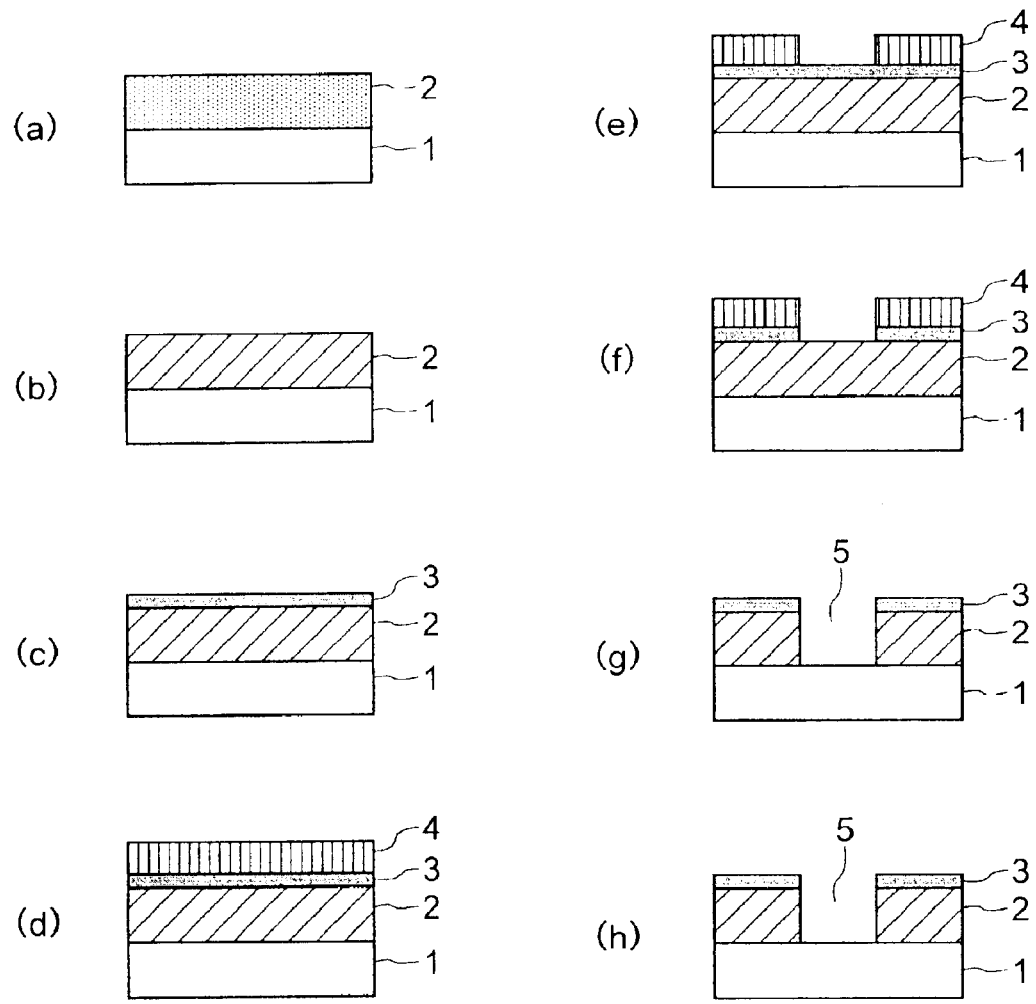

1 . . . substrate, 2 . . . organic low dielectric constant film, 3 . . . silicon oxide film, 4 . . . resist pattern, 5 . . . opening, 201, 301, 401, 701, 801, 901 . . . substrate, 501, 601 . . . lower wiring layer, 202, 302, 402, 502, 702, 802, 903, 1101, 1213, 1313, 1408, 1508, 1606, 1808 . . . first insulating layer, 203, 303, 403, 503, 602, 703, 803, 904, 1216, 1316, 1409, 1509, 1607, 1809 . . . second insulating layer, 504, 603 . . .

tungsten wiring, 704 . . . via hole, 705, 804, 1220, 1320 . . . third insulating layer, 706, 1221, 1321 . . . fourth insulating layer, 807, 1407, 1411, 1414, 1507, 1511, 1514 . . . wiring, 1223, 1323 . . . upper wiring, 1201, 1301 . . . p-type semiconductor substrate, 707, 1202, 1302 . . . trench, 1203, 1204, 1303, 1304 . . . oxide film, 1205, 1305 . . . n-type well region, 1206, 1306 . . . p-type well region, 1207, 1307 . . . gate insulating layer, 1208, 1308 . . . gate electrode, 1209, 1309 . . . cap insulating layer, 1210, 1212, 1310, 1312 . . . n-type semiconductor region, 1211, 1311 . . . side-wall spacer, 1214A, 1214B, 1217, 1314A, 1314B, 1317 . . . connecting hole, 906, 909, 1215, 1218, 1315, 1318, 1406, 1410, 1413, 1506, 1510, 1513 . . . electroconductive plug, 1219, 1224, 1319, 1324, 1416, 1516 . . . silicon nitride film, 1222 . . . tungsten, 1322 . . . guard ring portion, 1225, 1325, 1417, 1517 . . . polyimide film, 901, 1401, 1501, 1601, 1701 . . . semiconductor substrate, 1402, 1502 . . . element isolation region, 1403, 1503 . . . MOS transistor, 1404, 1504 . . . insulating film, 1405, 1505 . . . BPSG film, 21, 51, 71, 72, 81, 91, 92, 93, 94, 101, 102, 103, 110, 111, 1412, 1415, 1512, 1515, 1811, 1813 . . . laminated interlaminar insulating film, 1416, 1602, 1702 . . . passivation film, 1603, 1703 . . . aluminum pad, 1604, 1704, 1902, 2002 . . . polyimide chip coat film, 1605, 1705 . . . rearrangement wiring, 1606, 1706 . . . insulating layer, 1608, 1707 . . . under-bump metal layer, 1609, 1708 . . . solder bump, 1801, 1806 . . . ceramic layer, 1802 . . . inner layer wiring, 1803 . . . upper electrode (Ni layer), 1804 . . . lower electrode (Ni layer), 1805 . . . Au layer, 1807 . . . first aluminum wiring layer, 1810 . . . second aluminum wiring layer, 1812 . . . third aluminum wiring layer, 1814 . . . Cr/Ni—Cu layer, 1815 . . . Ni/Au layer, 204, 304, 805, 806, 905, 1103 . . . resist pattern, 902 . . . first wiring layer, 907 . . . second wiring layer, 910 . . . third wiring layer, 912 . . . fourth wiring layer, 1003, 1005 . . . copper, 914, 1007, 1104 . . . fifth wiring layer, 1001, 1101 . . . organic insulating layer, 1002, 1102 . . . polymer insulating layer, 1901, 2001 . . . semiconductor element, 1903, 2005, 2006 . . . outer terminal, 1904 . . . polyimide film, 1905, 2004 . . . gold wire, 1906, 2003 . . . epoxy resin.

BEST MODES FOR CARRYING OUT THE INVENTION

The present semiconductor device is provided with an interlayer insulating film layer laid on a wiring layer, which comprises at least one of layers each comprising a first insulating layer composed of an organic insulating film as a lower layer and a second insulating layer composed of an organometallic polymer material laid thereon as an upper layer.

It is preferable that the organic insulating film has a relative dielectric constant of not more than 3.5 and is formed from a thermosetting resin by baking treatment. It is also preferable that the organometallic polymer material has a relative dielectric constant of less than 4.0.

It is also preferable that at least one of the first insulating layer composed of said organic insulating film and the second insulating layer composed of said organometallic polymer is formed by coating, and at least the thickness of the second insulating layer is not more than that of the first insulating layer.

The second insulating layer composed of the organometallic polymer material according to the present invention is formed by exposure to a plasma gas containing, preferably, oxygen as the main component and then by baking.

The first insulating layer composed of the organic insulating film according to the present invention has an opening which is formed preferably by dry etching using a plasma gas containing oxygen as the main component by means of the second insulating layer composed of the organometallic polymer material as a mask.

The organometallic polymer has organic functional groups that can be decomposed and removed by dry etching, using a plasma gas containing oxygen as the main component and by heating.

Still furthermore, the hardness of the second insulating layer composed of the organometallic polymer can be increased by dry etching, using a plasma gas containing oxygen as the main component and by baking.

The present organometallic polymer is preferably a ladder silicone-based polymer having a molecular structure represented by the following formula (I) or (II). In the formula (I), R is an alkali-soluble group-containing organic group. In the formula (II), R' is an organic group, and n is a number of repeat units to give a desired molecular weight, which is a positive number of 2 or more, preferably 2 to 2,000.

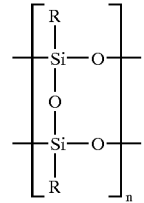

(I)

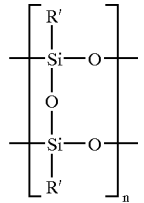

(II)

The organic group containing alkali-soluble group (R) preferably includes those represented by the formula:

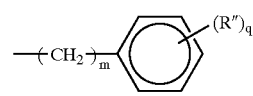

wherein m is an integer of 1–3; R" is a hydroxyl group; and q is an integer of 1–3, more concretely, a group of the formula:

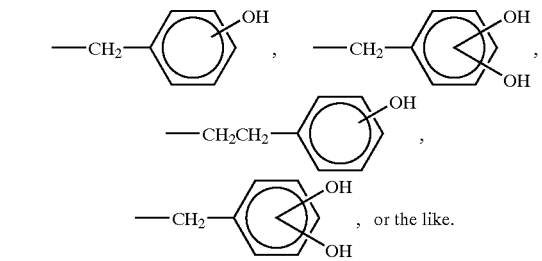

The organic group (R') preferably includes those represented by the formula:

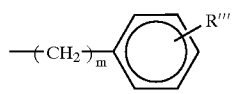

wherein m is an integer of 1–3; and R''' is an alkoxy group having 1 to 3 carbon atoms, more concretely, a group of the formula:

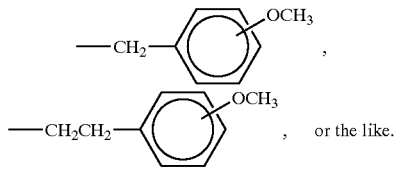

, or the like.

The second insulating layer composed of the organometallic polymer material can be formed preferably from a photo-sensitive resin material comprising a ladder silicone-based polymer material and a photo-sensitizer.

The present electronic circuit device is provided with an insulating film interlayer laid on a wiring layer, the insulating film interlayer comprising a first insulating layer composed of an organic insulating film as a lower layer and a second insulating layer composed of an organometallic polymer material laid thereupon as an upper layer, where the thickness of the interlayer insulating film layer can be made smaller due to the low relative dielectric constant.

The present semiconductor device can be produced through a step of spin coating an organic insulating film material onto a substrate, thereby forming a first insulating layer, a step of spin coating an organometallic polymer material onto the first insulating layer, thereby forming a second insulating layer, a step of forming an opening-forming resist pattern on the second insulating layer, a step of forming an opening in the second insulating layer by means of the resist pattern as a mask, a step of forming an opening pattern on the first insulating layer by dry etching, using a plasma gas containing oxygen as the main component by means of a pattern comprising the resist and the second insulating layer as a mask, while removing the resist at the same time, and a step of thermosetting an interlayer insulating film comprising the organometallic polymer material and the organic insulating film.

The organometallic polymer material is preferably a ladder silicone-based polymer material represented by said formula (I) or (II), capable of forming an opening-forming resist pattern and also forming an opening in the second insulating layer composed of the organometallic polymer material.

By using a photo-sensitive resin material comprising a ladder silicone-based polymer material and a photo-sensitizer as the organometallic polymer material, an opening can be formed in the second insulating layer composed of the organometallic polymer material without forming the opening-forming resist pattern.

A step of patterning the interlayer insulating film layer comprising the first insulating layer and the second insulating layer is at least one of a step of forming a contact hole and a step of forming a wiring trench.

In the present invention, it is preferable that the organic insulating film is formed from a thermosetting resin and is subjected to patterning in a semi-thermosetting state at temperatures of less than 350° C., preferably 349° C. to 150° C., and then to ultimate thermosetting or baking at temperatures of not less than 350° C., preferably 350° C. to 500° C., more preferably 350° C. to 450° C.

As the organic insulating film, there can be used films of polyimides, poly-p-xylylenes, polyarylene ethers, polyarylenes, polybenzocyclobutenes, polynaphthalenes, fluorinated polyimides, polyquinolines, polysiloxane polyimides, polyperfluorocarbons, fluorinated polyarylene ethers, fluorinated polybenzocyclobutenes, polyetherimides, polyphenylquinoxalines, fluorinated polybenzoxazols, polycarbodiimides, etc.

As the thermosetting resin, there can be used those conventionally used and fluorinated maleimides, arylated polyphenylene ethers, etc.

Still furthermore, in the step of forming an opening pattern on the first insulating layer according to the present invention, the second insulating layer composed of an organometallic polymer material is used as a mask to carry out dry etching by a plasma gas containing oxygen as the main component and remove the resist pattern formed on the second insulating layer thereby at the same time.

The organic insulating film as the first insulating layer is formed from a thermosetting resin by baking at temperatures of not less than 350° C., whereas the second insulating layer is formed from an organometallic polymer by exposure to a plasma gas containing oxygen as the main component and then by thermosetting.

The organometallic polymer material has organic functional groups, which can be decomposed and removed by dry etching, using a plasma gas containing oxygen as the main component and by heating to form an opening in the second insulating layer. In that case, it is preferable to conduct the dry etching at temperatures of not more than the temperature at which the organic insulating film is in a semi-thermosetting state.

The present invention is characterized in that, when an opening is to be formed in the first insulating layer composed of an organic insulating film, which constitutes an interlayer insulating film, the second insulating layer composed of an organometallic polymer material is used as a mask for the etching and the patterning is carried out while keeping the organic insulating film in a semi-thermosetting state.

That is, in the conventional case of patterning completely thermoset or baked organic insulating film by dry etching, using an oxygen-containing plasma gas, the released gas components have adverse effects on the successive step, giving rise to, for example, a filling failure called "poisoned via", a contact failure, and an increase in the resistance, whereas in the present invention the patterning of the organometallic polymer is carried out in a semi-thermosetting state at temperatures of less than 350° C., followed by ultimate baking at temperatures of not less than 350° C., thereby eliminating the adverse effects of the released gas components, etc.

Furthermore, the second insulating layer composed of an organometallic polymer material can be formed by coating, and thus costs pertaining to film-forming apparatuses can be considerably reduced as compared with the conventional process (CVD film-forming process) and also the cycle time can be shortened.

Still furthermore, formation of the insulating film by coating is distinguished in the gas-filling ability as well as the surface-flattening ability and thus steps of flattening such as etching-back, CMP (chemical-mechanical polishing), etc. so far required can be omitted.

When the organometallic polymer material is a ladder silicone-based polymer material, the film contains silicon atoms and thus the film can be modified into a film of higher strength such as a silicon oxide film by exposure to a plasma gas containing oxygen as the main component. That is, the opening-formed second insulating layer can be directly used for the interlayer insulating film together with the first insulating layer. Particularly, the ladder silicone-based polymer material has a lower relative dielectric constant than that of silicon oxide-based interlayer insulating film (relative dielectric constant: not less than 4.0) formed by the conventional CVD process, and thus is very effective for an interlayer insulating film.

The organic insulating film is made typically from polyarylene ether, polyarylene, polyimide, polybenzocyclobutene, etc., as already mentioned before, but the organic insulating film material is not limited thereto, but any organic material can be used so long as it has a lower relative dielectric constant than that of silicon oxide and is susceptible to dry etching, using a plasma gas containing oxygen as the main component.

Effects of oxygen plasma treatment on insulating films composed of ladder silicone-based polymer material will be described below.

Table 1 shows hardnesses (values at the position by 50 nm distant from the surface) of ladder silicone-based polymer material having a molecular structure represented by the following formula (IV) [number average molecular weight (Mn)=3,060; weight average molecular weight (Mw)=4,058; γ (Mw/Mn)=1.33 (where the molecular weights are determined by liquid chromatography based on ultraviolet ray absorption as a detector)] in terms of relative values to the hardness of silicon wafer.

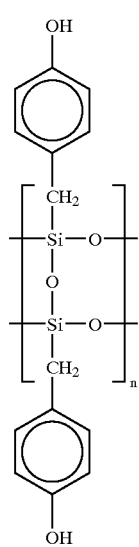

(IV)

Hardnesses (values at the position by 50 nm distant from the surface) of ordinary methylsilsesquioxane-based organic SOG material and hydrogen silsesquioxane-based inorganic SOG material are also shown together therein for comparison.

Insulating film with oxygen plasma treatment, which was made from the ladder silicone-based polymer material was prepared by the following steps:

Ladder silicone-based polymer material was spin coated onto a Si wafer and then baked, for example, at a temperature of not more than 250° C. to bring the coating film into a semi-thermosetting state. Then, the coated wafer was subjected to oxygen ashing treatment under the following conditions and then to heat treatment in a nitrogen gas stream, for example, at 400° C. for 60 minute to form a final insulating film.

Available oxygen ashing treatment conditions are, for example, RF output: 800 W; pressure: 1.0 Torr; substrate temperature: 60° C.; oxygen flow rate: 400 sccm.

Insulating film without oxygen plasma treatment was prepared in the same manner as above except for no such oxygen ashing treatment as mentioned above to form a final film.

Comparative insulating films were prepared from HSG-R7 (trademark of methylsilsesquioxane-based organic SOG material, made by Hitachi Chemical Co., Ltd.) and OCD-Type 12 (trademark of hydrogen silsesquioxane-based inorganic SOG material, made by Tokyo Ohka Kogyo Co., Ltd.), respectively, in the same manner as above except for the oxygen ashing treatment. Film thicknesses were 300 nm in all the cases.

These films were subjected to an indentation hardness test by a well known Berkovitch type diamond indenter to obtain hardnesses of the individual films upon comparison with the well known hardness of fused silica.

TABLE 1

Comparison of hardnesses of individual materials

| Materials | Hardness relative to that of Si wafer |
| --- | --- |
| Ladder silicone-based polymer without oxygen plasma treatment | 0.08 |
| Ladder silicone-based polymer with oxygen plasma treatment | 0.23 |
| Organic SOG | 0.08 |
| Inorganic SOG | 0.15 |

It is evident from the foregoing results that the insulating film made from ladder silicone-based polymer material, when subjected to the oxygen ashing treatment, has a film hardness about 3 times as large as that of the film without the oxygen ashing treatment and also has a considerably higher hardness than those of the organic SOG film and the inorganic SOG film as shown for comparison. This phenomenon is due to decomposition and removal of the organic functional groups of ladder silicone-based polymer material by the ashing treatment.

The conditions for plasma-treating the insulating film are not limited to those of the aforementioned test. For the conditions for heat treatment, a temperature range must be properly selected so that the heat treatment can be carried out in a temperature range below the temperature dependent on the thermosetting temperature of the insulating film (i.e. in a semi-thermosetting state) at the first stage and then carried out to complete ultimate baking at the second stage.

Specific embodiments of semiconductor devices according to the present invention will be described in detail below, referring to the drawings.

EXAMPLE 1

Figure 2:
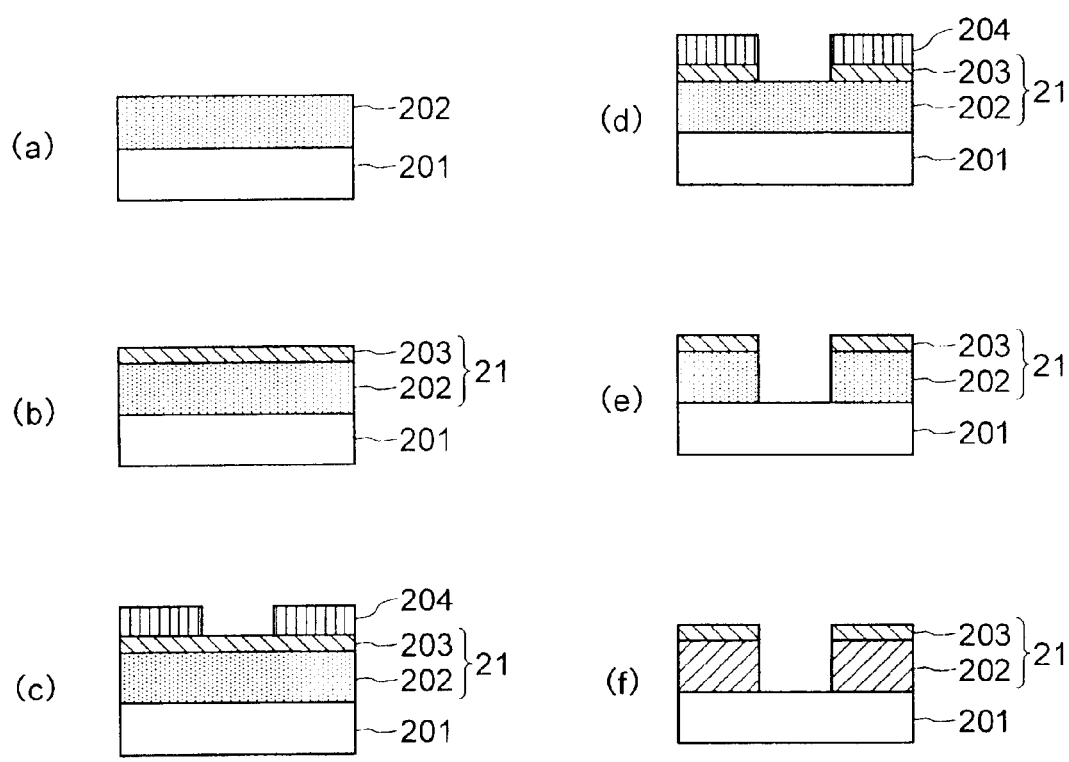

FIG. 2 shows process steps of producing a semiconductor device according to a first embodiment of the present invention.

At first, an organic insulating film material FLARE™ (a trade name, polyarylene ether,

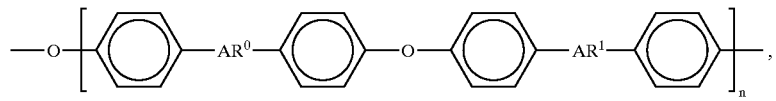

wherein $AR^0$, $AR^1$ are aromatic groups, made by Honeywell, Ltd.) is spin coated onto semiconductor substrate 201 of silicon or the like by a well known spinner and heated on a hot plate successively at temperatures such as 150°, 200° C. and 250° C. each for one minute to form first insulating layer 202 in a semi-thermosetting state [FIG. 2(a)], where first insulating layer 202 is 400 nm thick.

Then, ladder silicone-based polymer material represented by the following formula (III) [number average molecular weight (Mn)=2,032; weight average molecular weight (Mw)=2,576, γ (Mw/Mn)=1.27 (where molecular weights are determined by liquid chromatography based on ultraviolet ray absorption as a detector)] is spin coated onto first insulating layer 202, and heated on a hot plate successively at temperatures of 90° C. and 140° C. each for one minute [FIG. 2(b)], where second insulating layer 203 made from the ladder silicone-polymer material is 100 nm thick.

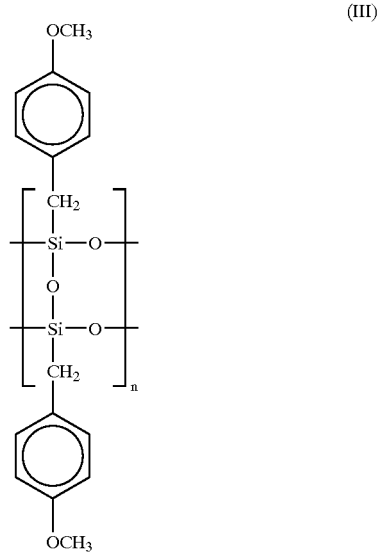

(III)

Then, a wiring-forming resist TDUR-P080 (trademark of a product made by Tokyo Ohka Kogyo Co., Ltd.) is spin coated onto second insulating layer 203 and heated on a hot plate at 90° C. for 1.5 minutes, and then subjected to light exposure by a well known KrF laser stepper and development by NMD-3 (a trade name, 2.38% aqueous solution of tetramethylammonium hydroxide (TMAH), made by Tokyo Ohka Kogyo Co., Ltd.) to form resist pattern 204 [FIG. 2(c)].

Then, second insulating layer 203 is subjected to patterning in an ordinary dry etching apparatus, e.g. Unity 2-85DL by means of resist pattern 204 as a mask, using a mixed gas of $CF_4$ (95%)/$O_2$ (5%) as an etching gas [FIG. 2(d)].

After heating on a hot plate e.g. at 100° C. for 1.5 minutes, first insulating layer 202 in a semi-thermosetting state is subjected to opening formation by means of both resist pattern 204 and patterned second insulating layer 203 as a mask, using an $O_2$ plasma gas [FIG. 2(e)].

In that time, resist pattern 204 is removed by the etching at the same time, but second insulating layer 203 is modified into a film similar to a silicon oxide film through oxidation and decomposition of the organic functional groups of ladder silicone-based polymer material. The modified film is no more etched even upon exposure to the $O_2$ plasma and thus can act as an etching mask.

Then, the resulting opening is washed with a cleaning solution ST-250 (trademark of a product made by ACSI Co., and then interlayer insulating film 21 comprising second insulating layer 203 made from the ladder silicone-based polymer material and first insulating layer 202 made from the organic insulating film material as a whole is subjected to ultimate baking treatment by heating at 400° C. for 60 minutes in an $N_2$ atmosphere at an oxygen concentration of not more than 10 ppm.

A semiconductor device has been completed through the aforementioned process steps.

Gas components released from interlayer insulating film 21 at low temperatures and cleaning solution components remaining in the via hole can be all stripped off by conducting the predetermined patterning of the interlayer insulating film in a semi-thermosetting state and successive ultimate baking, thereby eliminating adverse effects on the successive process step of forming a metallic film, such as wirings, etc. in the via hole, resulting in, for example, suppressing of poisoned via hole generation, etc.

Furthermore, the effective relative dielectric constant of the interlayer insulating film can be lowered by using a ladder silicone-based polymer material having a considerably lower relative dielectric constant than that of silicon oxide film made by a so far well known CVD film-forming process as part of the interlayer insulating film.

Still furthermore, the aforementioned insulating film can be formed by coating, and thus not only the cost pertaining to the film-forming apparatus can be largely reduced, as compared with the conventional CVD film-forming process, but also the cycle time can be shortened.

EXAMPLE 2

Figure 3:
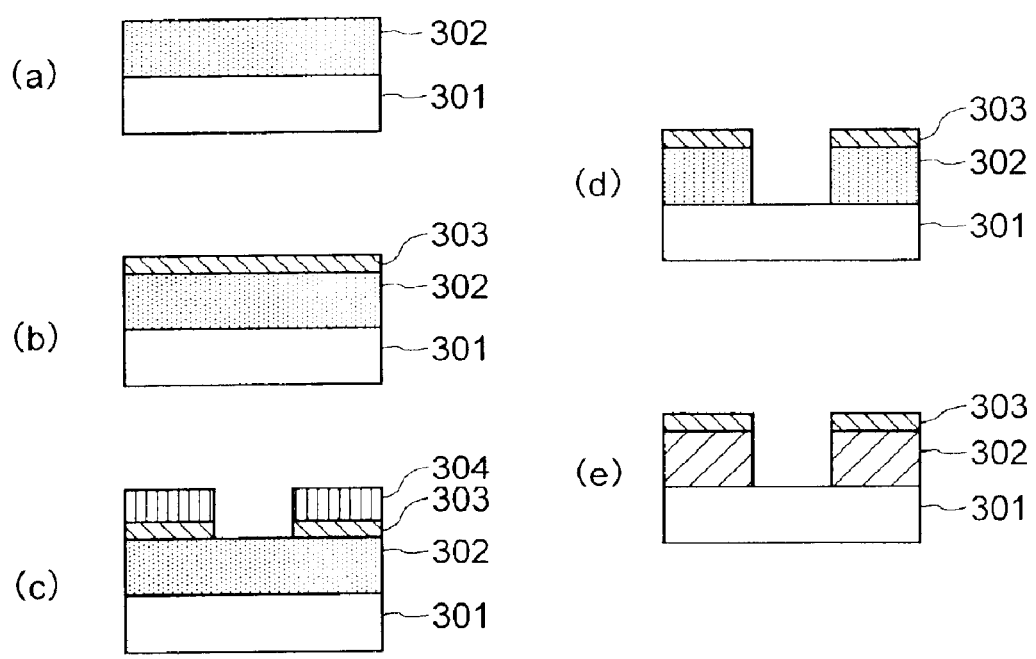

FIG. 3 shows process steps of producing a semiconductor device according to a second embodiment of the present invention.

Process step of forming first insulating layer 302 (film thickness: 400 nm) in a semi-thermosetting state, from an organic insulating film material FLARE™ (trademark of a product made by Honeywell, Ltd.) on semiconductor substrate 301 of silicon or the like is the same as in Example 1 [FIG. 3(a)].

Then, ladder silicone-based polymer material having a molecular structure represented by the following formula (IV) [number average molecular weight (Mn)=3,060; weight average molecular weight (Mw)=4,058; γ (Mw/Mn)=1.33] is spin coated onto said first insulating layer 302.

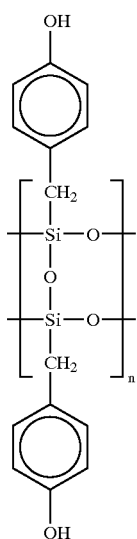

(IV)

Then, heat treatment is carried out on a hot plate successively at 90° C. and 140° C. each for one minute [FIG. 3(b)], where second insulating layer 303 made from ladder silicone-based polymer material is 100 nm thick.

Then, resist pattern 304 is formed on second insulating layer 303 in the same manner as in Example 1 [FIG. 3(c)], where second insulating layer 303 having alkali-soluble functional groups are patterned at the same time.

Process steps of opening formation in first insulation film 302 and successive ultimate heat treatment of both first insulating layer 302 and second insulating layer 303 to complete a semiconductor device are carried out in the same manner as in Example 1 [FIGS. 3(d) and (e)].

A semiconductor device has been completed through the aforementioned process steps.

In this Example, not only the same effects as in Example 1 can be obtained, but also patterning of the second insulating layer can be attained at the same time as development of the resist pattern, and thus the process can be more simplified.

EXAMPLE 3

Figure 4:
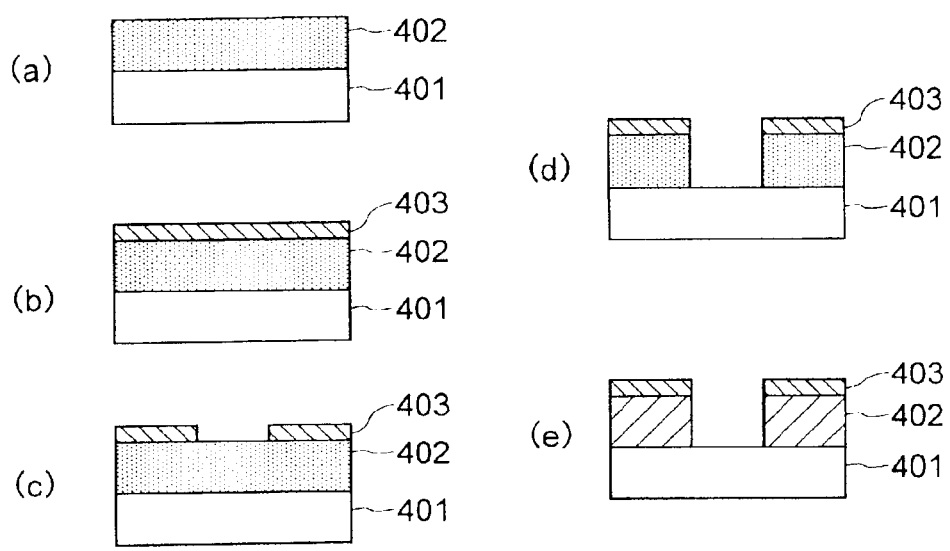

FIG. 4 shows process steps of producing a semiconductor device according to a third embodiment of the present invention.

Process step of forming first insulating layer 402 in a semi-thermosetting state on semiconductor substrate 401 of silicon or the like is carried out in the same manner as in Example 1 [FIG. 4(a)].

Then, a ladder silicone-based polymer material having a molecular formula represented by the aforementioned formula (IV) [number average molecular weight (Mn)=3,060; weight average molecular weight (Mw)=4,058; γ (Mw/Mn)=1.33]] and containing a positive type resist photo-sensitizer is spin coated as second insulating layer 403 onto first insulating layer 402, and prebaked on a hot plate, for example, at 90° C. [FIG. 4(b)].

Then, by light exposure by a well known KrF laser stepper and development by NMD-3 (trademark of a product made by Tokyo Ohka Kogyo Co., Ltd.), second insulating layer 403 having alkali-soluble functional groups and containing the positive type resist photo-sensitizer is patterned [FIG. 4(c)].

Then, an opening is formed in first insulating film 402 by means of second insulating layer 403 as a mask, using $O_2$ plasma [FIG. 4(d)], and the successive process steps of completing a semiconductor device through ultimate baking are carried out in the same manner as in the process steps FIGS. 2(e) to (f) of Example 1 [FIG. 4(e)].

A semiconductor device has been completed through the aforementioned process steps.

In this Example, not only the same effects as in Example 2 can be obtained, but also the process step of forming a resist pattern can be obtained by using the ladder silicone-based polymer material containing a positive type resist photo-sensitizer as the second insulating layer, and the process can be further simplified as an advantage.

Needless to say, opening-forming process step of Examples 1 to 3 can be also applied to any of a step of forming a contact hole and a step of forming a wiring trench in the insulating layer.

EXAMPLE 4

Figure 5:
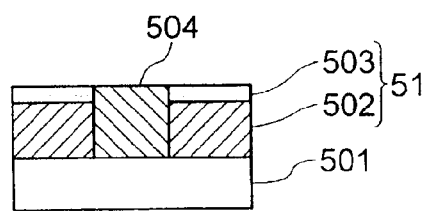
FIG. 5 is a cross-sectional view of a semiconductor device according to Example 4.

FIG. 5 is a cross-sectional view of a semiconductor device according to a fourth embodiment of the present invention. As in Example 1, interlayer insulating film 51 comprising first insulating layer 502 composed of an organic insulating film material FLARE™ (trademark of a product made by Honeywell, Ltd.) as a lower layer and second insulating layer 503 composed of a ladder silicone-based polymer material laid thereon as an upper layer is formed on wiring underlayer 501, followed by opening formation in said interlayer insulating film 51. Needless to say, said interlayer insulating film 51 can be formed by any of the processes of Examples 1 to 3.

Then, wiring 504 of e.g. tungsten is filled in the opening by a well known process, e.g. CVD process to complete a semiconductor device.

FIG. 5 relates to the case of forming a single layer of interlayer insulating film 51 comprising first insulating layer 502 and second insulating layer 503, but, needless to say, a semiconductor device with a plurality of the interlayer insulating films can be formed by repetition of the aforementioned process steps.

Any of the insulating films has a lower relative dielectric constant than that of the conventional inorganic insulating films and thus not only the interlayer capacitance can be reduced, but also adverse effects of released gas components, etc. on the successive step can be eliminated by processing the second insulating layer in a semi-thermosetting state at temperatures of less than 350° C., and then conducting the ultimate baking at temperatures of not less than 350° C. As a result, a filling failure e.g. so called poisoned via, a contact failure, and an increase in the resistance can be suppressed.

EXAMPLE 5

Figure 6:
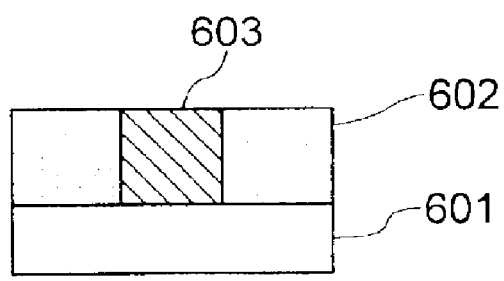
FIG. 6 is a cross-sectional view of a semiconductor device according to Example 5.

FIG. 6 is a cross-sectional view of a semiconductor device according to a fifth embodiment of the present invention. Differences from Example 4 are that the interlayer insulating film provided on wiring underlayer 601 is composed only of second insulating layer 602 composed of a ladder silicone-based polymer material, where the case of a single layer of the interlayer insulating film is shown, and wiring 603 of e.g. tungsten is filled in the opening in the interlayer film, while others are the same as in Example 4.

The second insulating layer composed of a ladder silicone-based polymer material has a relative dielectric constant of less than 4.0, which is smaller than that of the conventional inorganic insulating film. Thus, not only the interlayer capacitance can be reduced, but also adverse effects of released gas components, etc. on the successive process step can be eliminated by processing the second insulating layer in a semi-thermosetting state below 350° C. and conducting the ultimate baking at not less than 350° C. As a result, a filling failure e.g. so called poisoned via hole generation, a contact failure, and an increase in the resistance can be suppressed.

EXAMPLE 6

Figure 7:
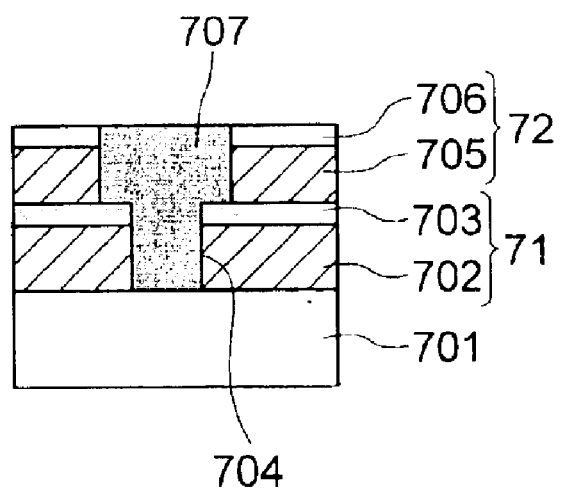
FIG. 7 is a cross-sectional view of a semiconductor device according to Example 6.

Sixth embodiment relates the case of applying the present invention to a semiconductor device a dual damascene structure and will be described lelow, referring to FIG. 7.

At first, an organic insulating film material FLARE™ (trademark of a product made by Honeywell, Ltd.) is spin coated onto semiconductor substrate 701 of e.g. silicon and then subjected to heat treatment on a hot plate successively at 150° C., 200° C., and 250° C. each for one minute to form first insulating layer 702 (film thickness; 300 nm) in a semi-thermosetting state.

Then, a ladder silicone-based polymer material having a molecular structure represented by the aforementioned formula (IV) [number average molecular weight (Mn)=3,060; weight average molecular weight (Mw)=4,058; (Mw/Mn= 1.33) spin coated onto first insulating layer 702 and subjected to heat treatment on a hot plate successively, e.g. at 90° C. and 140° C. each for one minute, where second insulation film 703 composed of the ladder silicone-based polymer material is 50 nm thick.

Then, contact hole-forming resist TDUR-P036 (trademark of a product made by Tokyo Ohka Kogyo Co., Ltd.) is spin coated onto second insulating layer 703 and heated on a hot plate at 80° C. for 1.5 minutes, followed by light exposure by a well known KrF laser stepper and development of NMD-3 (trademark of a product made by Tokyo Ohka Kogyo Co., Ltd.) to form a resist pattern for forming a contact hole (not shown in the drawings). At that time, second insulating layer 703 having alkali-soluble functional groups can be also pattened.

After heating on a hot plate, e.g. at 120° C. for 1.5 minutes, an opening is formed in first insulating layer 702 by means of both the resist pattern and patterned second insulating layer 703 as a mask, using, e.g. an $O_2$ plasma gas, where the resist pattern can be removed at the same time.

Then, the opening is washed with a cleaning solution ACT NP-K101 (trademark of a product made by ACT Co.), and then first interlayer insulating film 71 comprising second insulating layer 703 and first insulating layer 702 as the whole is subjected to ultimate baking treatment by heating at 400° C. for 60 minutes in a $N_2$ atmosphere having an oxygen concentration of not more than 10 ppm.

Then, an organic insulating film material FLARE™ (trademark of a product made by Honeywell, Ltd.) is spin coated onto second insulating layer 703 and subjected to heat treatment on a hot plate successively, e.g. at 150° C., 200° C., and 250° C. each for one minute to form third insulating layer 705 (film thickness: 300 nm) in a semi-thermosetting state.

A ladder silicone-based polymer material having a molecular structure represented by the aforementioned formula (IV) [number average molecular weight (Mn)=3,060; weight average molecular weight (Mw)=4,058; γ (Mw/ Mn)=1.33] is spin coated onto third insulating layer 705 and subjected to heat treatment on a hot plate successively at 90° C. and 140° C. each for 1 minute to form fourth insulating layer 706 (film thickness: 50 nm).

Then, an opening is formed in second interlayer insulating film 72 comprising third insulating layer 705 and fourth insulating layer 706, and ultimate baking treatment is carried out in the same manner as for the case of said first interlayer insulating film 71.

Then, Cu is filled in via hole 704 and wiring trench 707 by a well known process, e.g. CVD process or plating process.

Then, by removing the unwanted Cu film present on fourth insulating layer 706 as the uppermost layer, the connection plug and the wiring are formed at the same time, thereby producing a semiconductor device. For removal of the Cu film, it is convenient to use chemical mechanical polishing with a polishing agent comprising alumina or silica as an abrasive, and additives such as Cu complexing agent, a surfactant, etc. so as to polish Cu, but not to polish the fourth insulating layer similar to the silicon oxide film.

Metal to be filled in the opening is not limited to Cu, but any metal capable of attaining the object of this Example can be used. In FIG. 7, a double layer of the interlayer insulating films is shown, but, needless to say, a semiconductor device having a plurality of the interlayer insulating films can be obtained by repeating the aforementioned process steps.

As mentioned above, the relative dielectric constant of the interlayer insulating film can be made lower than those of the conventional inorganic insulating films, and thus not only a semiconductor device having an interlayer insulating film with a reduced interlayer capacitance can be obtained, but also a filling failure e.g. so called poisoned via hole generation, a contact failure, and an increase in the resistance, which have been regarded as serious problems, can be suppressed.

EXAMPLE 7

Figure 8:
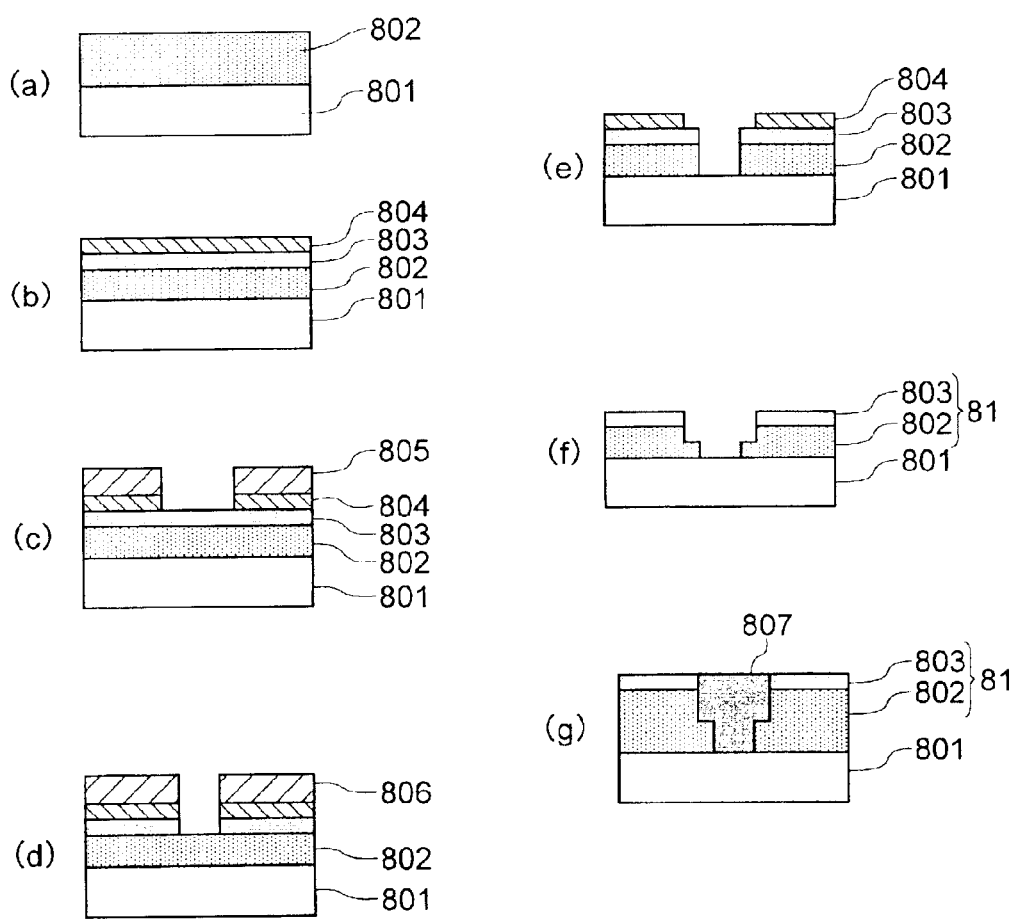

FIG. 8 shows process steps of producing a semiconductor device according to a seventh embodiment of the present invention.

At first, an organic insulating film material SiLK™ (a trade name, polyarylene, whole aromatic organic polymer containing no fluorine, made by Dow Chemical Co.) is spin coated onto semiconductor substrate 801 of silicon or the like and subjected to heat treatment on a hot plate successively at 180° C. and 320° C. each for one minute to form first insulating layer 802 (film thickness: 800 nm) in a semi-thermosetting state [FIG. 8(a)].

Then, a ladder silicone-based polymer material having a molecular structure represented by the aforementioned formula (III) [number average molecular weight (Mn)=2,032; weight average molecular weight (Mw)=2,576; γ (Mw/ Mn)=1.27] is spin coated onto first insulating layer 802, and heated on a hot plate at 90° C. to form second insulating layer 803 (film thickness: 100 nm).

Then, a ladder silicone-based polymer material having a molecular structure represented by the aforementioned formula (IV) [number average molecular weight (Mn)=3,060; weight average molecular weight (Mw)=4,058; (Mw/Mn)= 1.33]] is spin coated onto second insulating layer 803, and subjected to heat treatment on a hot plate successively at 90° and 140° C. each for one minute to form third insulating layer 804 (film thickness: 100 nm) [FIG. 8(b)].

Then, a wiring-forming resist TDUR-P080 (trademark of a product made by Tokyo Ohka Kogyo Co., Ltd.) is spin coated onto third insulating layer 804, and heated on a hot plate at 90° C. for 1.5 minutes, followed by light exposure by a well known KrF laser stepper and development by NMD-3 (trademark of a product made by Tokyo Ohka Kogyo Co., Ltd.) to form resist pattern 805, where third insulating layer 804 having alkali-soluble functional groups is patterned at the same time [FIG. 8(c)].

Then, resist pattern 805 is stripped off by a well known resist-stripping solution.

Then, a contact hole-forming resist TDUR-P036 (trademark of a product made by Tokyo Ohka Kogyo K.K.) is spin coated onto third insulating layer 804, and heated on a hot plate at 80° C. for 1.5 minutes, followed by light exposure and development in the same manner as mentioned above to form contact hole-forming resist 806.

Then, second insulating layer 803 is patterned by means of resist pattern 806 as a mask in an ordinary dry etching apparatus (Unity 2-85DI) using a mixed gas of $CF_4$ (95%)/$O_2$ (5%) as an etching gas [FIG. 8(d)].

Successively, an opening is formed in first insulating layer by means of both resist pattern 806 and second insulating layer 803 as a mask, using an $O_2$ plasma gas, where resist pattern 806 is removed at the same time [FIG. 8(e)].

Then, second insulating layer 803 is patterned by means of third insulating layer 804 as a mask, using a mixed gas of $CF_4$ (95%)/$O_2$ (5%), where third insulating layer 804 as the upper layer is removed at the same time.

Then, first insulating layer 802 is removed down to a desired film thickness by means of second insulating layer 803 as a mask, using an $O_2$ plasma gas to form an opening in first insulating layer 802.

Then, the opening is washed with a cleaning solution ACT NP-K101 (trademark of a product made by ACT), and interlayer insulating film 81 comprising second insulating layer 803 and first insulating layer 802 as the whole is subjected to heat treatment at 400° C. for 60 minutes in a $N_2$ atmosphere at an oxygen concentration of not more than 10 ppm to conduct ultimate baking [FIG. 8(f)].

Finally, copper 807 is filled in the opening provided in interlayer insulating film 81 to complete a semiconductor device [FIG. 8(g)].

Needless to say, in this Example, the same effects as in Example 4 shown in FIG. 5 can be also obtained except that the material of the first insulating layer is SiLK™ (trademark of a product made by Dow Chemical Co.), the inside diameter of the opening provided in the first insulating layer is changed therein, and the metal filled in the opening is copper.

EXAMPLE 8

Figure 9:
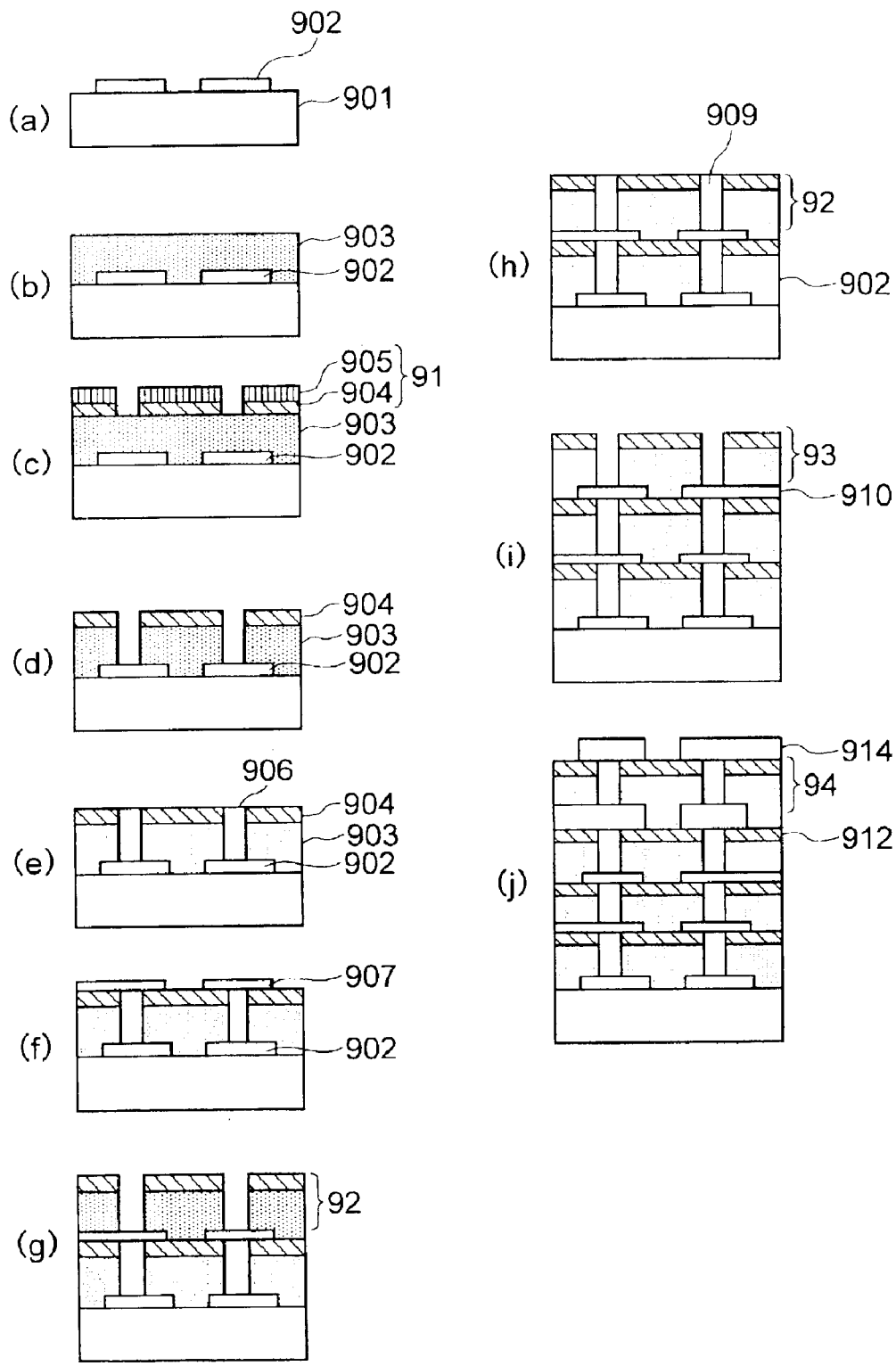

FIG. 9 shows process steps of producing a semiconductor device in a multilayered wiring structure according to an eighth embodiment of the present invention.

First wiring layer 902 composed of an aluminum alloy film is formed by a well known process on semiconductor substrate 901 provided with component devices such as MOS transistor, etc. (not shown in the drawing) and with a silicon oxide film formed e.g. by CVD process as an insulating film on the surface [FIG. 9(a)].

Then, an organic insulating film material FLARE™ (trademark of a product made by Honeywell, Ltd.) is spin coated onto semiconductor substrate 901 including first wiring layer 902, and subjected to heat treatment on a hot plate successively at 150° C., 200° C., and 250° C. each for one minute to form first insulating layer 903 (film thickness: 600 nm) in a semi-thermosetting state [FIG. 9(b)].

Then, a ladder silicone-based polymer material having a molecular structure represented by the aforementioned formula (III) [number average molecular weight (Mn)=2,032; weight average molecular weight (Mw)=2,576; γ (Mw/Mn)=1.27] is spin coated onto first insulating layer 903, and heated on a hot plate successively at 90° C. and 140° C. each for one minute to form second insulating layer 904 (film thickness: 100 nm).

Since said first insulating layer 903 and second insulating layer 904 are all formed by spin coating, there are no problems as to the surface flatness, resulting in omission of the ordinary flattening treatment such as etching-back, CMP, etc. in usual practice. Thus, said insulating layers 903 and 904 can be patterned in a semi-thermosetting state.

Then, a wiring-forming resist TDUR-P080 (trademark of a product made by Tokyo Ohka Kogyo Co., Ltd.) is spin coated onto second insulating layer 904, and heated on a hot plate at 90° C. for 1.5 minutes, followed by light exposure by a well known KrF laser stepper and development by NMD-3 (trademark of a product made by Tokyo Ohka Kogyo Co., Ltd.) to form resist pattern 905.

Then, second insulating layer 904 is patterned by means of resist pattern 905 as a mask, using the etching gas as used in Example 3 [FIG. 9(c)]. Successively, heating is carried out on a hot plate at 100° C. for 1.5 minutes, and an opening is formed in first insulating layer 903 by means of both resist pattern 905 and second insulating layer 904 as a mask, using an $O_2$ plasma gas, where resist pattern 905 is removed by the etching at the same time, and the organic functional group sites of the ladder silicone-based polymer material of the second insulating layer are decomposed by oxidation with the $O_2$ plasma gas, thereby converting the second insulating layer to a film similar to a silicon oxide film, which remains and acts as an etching mask [FIG. 9(d)].

Then, the opening is washed with a cleaning solution ACT NP-K101 (trademark of a product made by ACT Co.), and then first interlayer insulating film 91 comprising second insulating layer 904 and first insulating layer 903 as the whole is subjected to heat treatment at 400° C. for 60 minutes in a $N_2$ atmosphere at an oxygen concentration of not more than 10 ppm to conduct ultimate baking.

Gas components released from interlayer insulating film 91 at low temperatures and cleaning solution components remaining in the via hole are all stripped off thereby, and thus adverse effects such as poisoned via hole generation, etc. on the successive process step such as a process step of forming a metallic film, e.g. wiring, etc. can be eliminated.

Then, tungsten 906 is filled in the contact hole by a well known CVD process. At that time, unwanted tungsten present on the surface of second insulating layer 904 is removed by chemical mechanical polishing (CMP), using SEMI-SPERSE® W2000 (trademark of a product made by Cabot Corp.) as a polishing agent, where second insulating layer 904 is not substantially polished. That is, second insulating layer 904 acts as a polishing stopper against the etching, and polishing stops substantially when second insulating layer 904 is exposed [FIG. 9(e)].

Then, second wiring layer 907 composed of an aluminum alloy film is formed [FIG. 9(f)].

A multi-layer structure is then to be formed. By repeating the aforementioned process steps, second interlayer insulating layer 92, third wiring layer 910, third interlayer insulating layer 93, fourth wiring layer 912, fourth interlayer insulating layer 94, and fifth wiring layer 914 are successively formed [FIGS. 9(g) to 9(j)], where the organic insulating film and the ladder silicone-based polymer film, which make up fourth interlayer insulating layer 94, are 800 nm thick and 200 nm thick, respectively.

A semiconductor device with interlayer insulating films each comprising an organic insulating film and a ladder silicone-based polymer film can be prepared by further formation of a passivation film, formation of opening for connector pads, etc., though not shown in the drawing.

In this Example, description has been made above of the case of 4 layers of the interlayer insulating films, but a further multilayered wiring structure can be formed by further repetitions of the aforementioned process steps.

In this manner, a semiconductor device in a multilayered wiring structure with a much smaller interlayer capacitance than those of the conventional inorganic insulating films can be obtained, and as a result high speed operation be attained.

EXAMPLE 9

Figure 10:
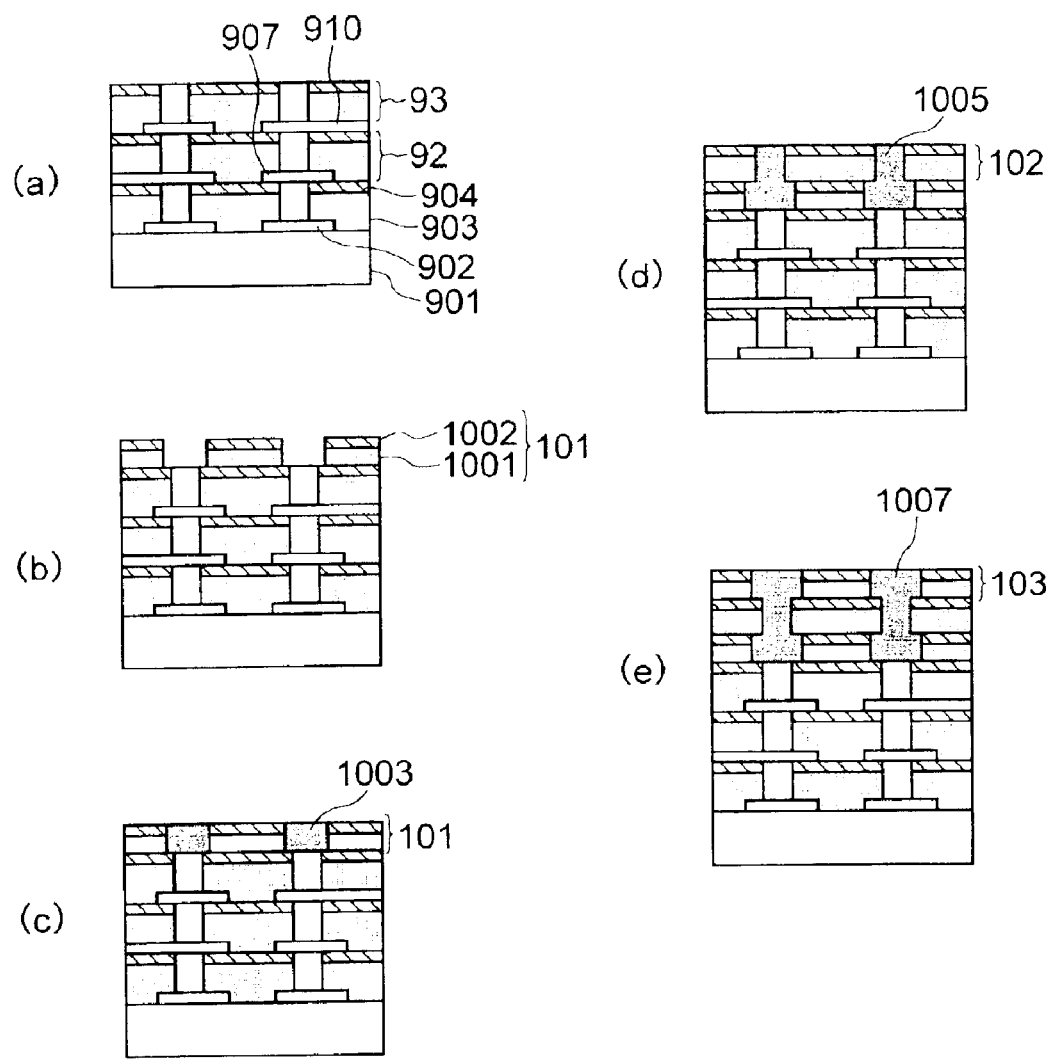

Ninth embodiment of the present invention relates to the case of using Cu for the fourth and fifth wiring layers of Example 8, and thus the same process steps as in Example 8 are omitted from the following description, and process steps of forming the fourth wiring layer and thereafter will be described below, referring to FIG. 10, where the same parts as in FIG. 9 are identified by the same reference numerals.

FIG. 10(a) shows the state that members up to third interlayer insulating film 93 have been formed.

Fourth interlayer insulating film 101 is to be formed. Insulating film 1001 (film thickness: 300 nm) in a semi-thermosetting state is formed in the same manner as in Example 8, using FLARE™ (trademark of a product made by Honeywell, Ltd.) as an organic insulating film material.

Then, insulating layer 1002 is formed in the same manner as in Example 7 or 8, using a ladder silicone-based polymer material of the aforementioned formula (IV) [number average molecular weight (Mn)=3,060; weight average molecular weight (Mw)=4,058; γ (Mw/Mn)=1.33].

When a resist pattern (not shown in the drawing) is formed, insulating layer 1002 composed of the ladder silicone-based polymer material having alkali-soluble functional groups can be also patterned at the same time. When insulating layer 1001 is etched by an oxygen plasma, the above-mentioned resist pattern can be removed at the same time, but insulating layer 1002 is not etched and acts as an etching mask.

By heat treatment in the same manner as in Example 8, fourth interlayer insulating film 101 can be formed [FIG. 10(b)].

Cu 1003 as a fourth wiring layer is filled in the opening formed in fourth interlayer insulating film 101 by a well known CVD process, and unwanted Cu 1003 present on the surface of fourth interlayer insulating film 101 is removed by the aforementioned CMP [FIG. 10(c)].

Then, fifth interlayer insulating film 102 is formed in the same manner as above, except that a contact hole-forming resist TDUR-P036 (trademark of a product made by Tokyo Ohka Kogyo Co., Ltd.) is used as the resist.

Then, Cu 1005 is filled in the contact hole formed in fifth interlayer insulating film 102, and unwanted Cu 1005 present on the surface of fifth interlayer insulating film 102 is removed in the same manner as in FIG. 10(c) [FIG. 10(d)].

Likewise, sixth interlayer insulating film 103 and fifth wiring layer 1007 are formed [FIG. 10(e)].

A semiconductor device with aluminum-copper mixed wirings can be obtained by further formation of a passivation film, formation of openings for connector pads, etc., though not shown in the drawing.

In this Example, needless to say, the same effects as in Example 8 can be obtained.

EXAMPLE 10

Tenth embodiment of the present invention relates to the case of forming the uppermost wiring layer of Example 9 by Cu dual damascene process, and thus the same process steps as in Example 9 are omitted from the following description, and process steps of forming the fifth interlayer insulating film and thereafter will be described below.

Figure 11:
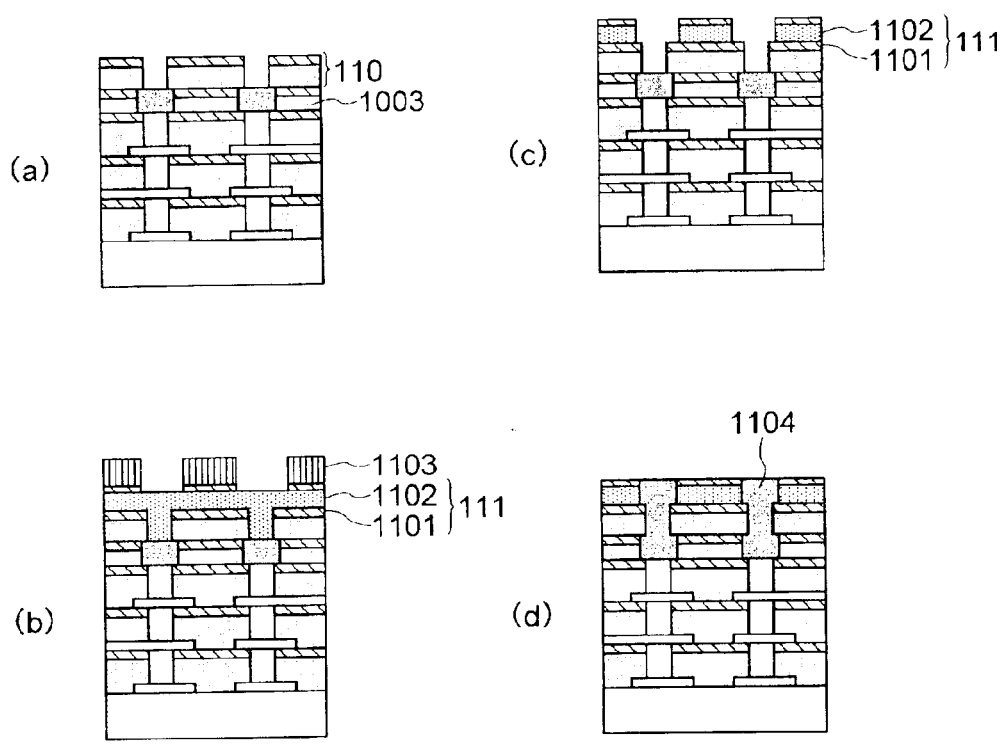

FIG. 11 shows process steps of producing a semiconductor device according to Example 10.

FIG. 11(a) shows that contact holes are formed in fifth interlayer insulating film 110.

Then, insulating film 1101 (film thickness: 400 nm) in a semi-thermosetting state is formed on fifth interlayer insulating film 110 in the same manner as mentioned above, using an organic insulating film material FLARE™ (trademark of a product made by Honeywell, Ltd.).

Then, insulating layer 1102 (film thickness: 100 nm) composed of a ladder silicone-based polymer material having a molecular structure represented by the aforementioned formula (III) [number average molecular weight (Mn)=2,032; weight average molecular weight (Mw)=2,576; γ (Mw/Mn)=1.27] is formed on said film 1101 in the same manner as above. Openings are formed in said insulating film 1102 by means of resist pattern 1103 as a mask in the same manner as in Example 1 [FIG. 11(b)].

Furthermore, openings are formed in organic insulating layer 1101 by means of patterned insulating layer 1102 as a mask in the same manner as above, where resist pattern 1103 is removed at the same time. Sixth interlayer insulating film 111 comprising insulating film 1101 and insulating layer 1102 is subjected to ultimate baking by heating at 400° C. for 60 minutes in a N₂ atmosphere at an oxygen concentration of not more than 10 ppm [FIG. 11(c)].

Then, Cu 1104 is filled in the above-mentioned via holes and wiring trenches, and unwanted Cu film present on insulating layer 1102 composed of the ladder silicone-based polymer material as the uppermost layer is removed by CMP, thereby forming connector plugs and wirings 1104 at the same time [FIG. 11(d)].

A semiconductor device with aluminum-copper mixed wirings can be prepared by formation of a passivation film, formation of openings for connector pads, etc., though not shown in the drawing.

Owing to the aforementioned structure, any of the interlayer insulating films has a lower relative dielectric constant than those of conventional inorganic insulating films, and thus not only the interlayer capacitance can be reduced, but also adverse effects of released gas components, etc., for example, those of the process steps of forming the first interlayer insulating film on the successive process step of forming the second interlayer insulating film, can be prevented due to working of the second insulating film in semi-cured state below 350° C. and final curing at 350° C. or higher. As a result, for example, a filling failure called "poised via hole generation", a contact failure and an increase in the resistance can be suppressed.

EXAMPLE 11

Figure 12:
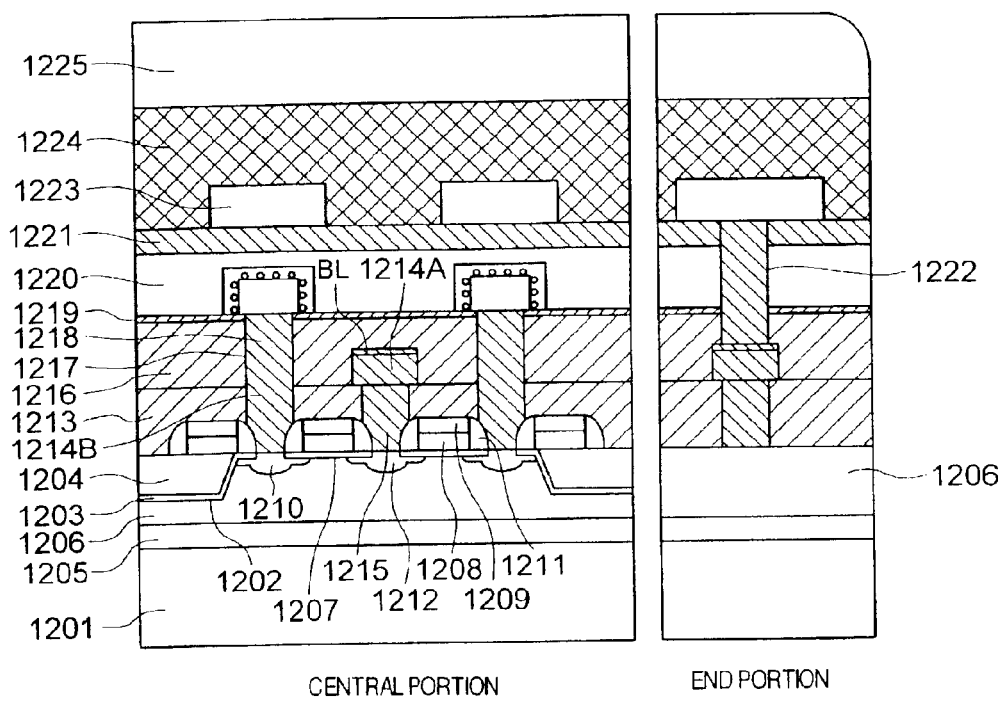
FIG. 12 shows process steps for producing a semiconductor memory device according to Example 11.

FIG. 12 is a cross-sectional view of a semiconductor DRAM (Dynamic Random Access Memory) device according to an eleventh embodiment of the present invention.

Trenches 1202 (depth: approximately 300–400 nm) are selectively formed in the device isolation region of p-type semiconductor substrate 1201 by a well known dry etching process.

Then, to remove the resulting etching damage layer on the inside walls of trenches 1202, thin oxide film (thickness: approximately 10 nm) is formed on the inside walls by a wet oxidation process, e.g. approximately at 850°–900° C. Then, oxide film 1204 (thickness: approximately 300–400 nm) is formed on the main surface of substrate 1201 including the interiors of trenches 1202 by a plasma CVD process using, e.g. ozone and tetraethoxysilane as source gases.

Then, oxide film 1204 is polished by chemical mechanical polishing (CMP) to remove oxide film 1204 from other regions than trenches 1201, thereby making oxide film 1204 remain in trenches 1202.

Then, the memory array-forming region of substrate 1201 is subjected to selective phosphorus ion implantation to form n-type well region 1205. Then, the main surface of n-type well region 1205 is subjected to selective boron ion implantation to form p-type well region 1206.

Then, gate insulating layer 1207 composed of an oxide film (thickness: approximately 7 nm) is formed on the surface of p-type well region 1206 by subjecting substrate 1201 to wet oxidation treatment at approximately 850° C. Then, gate electrodes 1208 are to be formed on gate insulating layer 1207. In this process step, word lines integrated with gate electrodes 1208 are also to be formed at the same time.

Gate electrodes 1208 and word lines (WL) are formed by forming an approximately 70 nm-thick, phosphorus-implanted polycrystalline silicon film by CVD process, then forming an approximately 50 nm-thick tungsten nitride film and an approximately 100 nm-thick tungsten film successively thereon by sputtering, and then forming cap insulating layer 1209 composed of an approximately 150 nm-thick silicon nitride film thereon by a CVD process, followed by patterning of these films.

Then, an approximately 50–100 nm-thick silicon nitride film is formed on the main surface of p-type well region 1206 by a CVD process, and the resulting silicon nitride film is subjected to anisotropic etching by a well known RIE (Reactive Ion Etching) process to form side wall spacers 1211 on the side walls of gate electrodes 1208. In this process step, side wall spacers 1211 are also formed on the side walls of word lines (WL).

Then, the main surface of n-type semiconductor region 1210 is subjected to arsenic ion implantation to form n-type semiconductor regions 1212. In this process step, memory cell-selecting field effect transistor in an LDD structure can be formed.

Then, first interlayer insulating film 1213 is to be formed on the main surface of p-type semiconductor substrate 1201. For first interlayer insulating film 1213, a ladder silicone-based polymer material having a molecular structure represented by the aforementioned formula (III) [number average molecular weight (Mn)=2,032; weight average molecular weight (Mw)=2,576; γ (Mw/Mn)=1.27 (the molecular weights are determined by liquid chromatography based on ultraviolet ray absorption as a detector)] is subjected to spin coating, followed by heating on a hot plate successively at 150° C. and 200° C. each for one minute.

Then, first interlayer insulating layer 1213 on n-type semiconductor region 1212 is to be selectively removed. That is, a contact hole-forming resist TDUR-P036 (trademark of a product made by Tokyo Ohka Kogyo Co., Ltd.) is spin coated on first interlayer insulating film 1213 and heated on a hot plate at 80° C. for 1.5 minutes, followed by light exposure by a well known KrF laser stepper and development by NMD-3 (trademark of a product made by Tokyo Ohka Kogyo Co., Ltd.) to form a resist pattern for forming contact holes 1214A and contact holes 1214B.

Then, first interlayer insulating layer 1213 is etched by means of the resist patten as a mask to form contact holes 1214A and contact holes 1214B. Then, the resist film is completely removed by oxygen ashing, and electroconductive plugs 1215 are to be formed in contact holes 1214A and contact holes 1214B. Electroconductive plugs 1215 are formed by forming an impurity-doped polycrystalline silicon film on first interlayer insulating layer 1213 by a CVD process and then polishing the polycrystalline silicon film by CMP.

Then, bit lines (BL), which are electrically connected to electroconductive plugs 1215 in contact holes 1214A, are formed. Second interlayer insulating layer 1216 is to be formed on second interlayer insulating layer 1213 including the surfaces of bit lines (BL). Second interlayer insulating layer 1216 is formed in the same manner as for first interlayer insulating layer 1213, and then silicon nitride film 1219 is formed thereon.

Then, second interlayer insulating layer 1216 and silicon nitride film 1219 on electroconductive plugs 1215 are selectively removed by dry etching to form contact holes 1217. Then, electroconductive plugs 1218 are to be formed in contact holes 1217. Electroconductive plugs 1218 are formed in the same manner as for electroconductive plugs 1215.

Then, a capacitor is formed on second interlayer insulating layer 1216 including electroconductive plugs 1218 by a well known procedure.

Then, SiLK™ (trademark of a product made by Dow Chemical Co.) is spin coated for forming third interlayer insulating layer 1220 and heated on a hot plate successively at 180° C. and 320° C. each for one minute to form a film (film thickness: 600 nm) in a semi-thermosetting state.

Then, a ladder silicone-based polymer material having a molecular structure represented by the aforementioned formula (IV) [number average molecular weight (Mn)=3,060; weight average molecular weight (Mw)=4,058; γ (Mw/Mn)=1.33] is spin coated onto third interlayer insulating film 1220 and heated on a hot plate at 90° C. to form fourth interlayer insulating layer 1221 (film thickness: 100 nm).

Then, a contact hole-forming resist TDUR-P036 (trademark of a product made by Tokyo Ohka Kogyo Co., Ltd.) is spin coated onto fourth interlayer insulating layer 1221, and heated on a hot plate at 80° C. for 1.5 minutes, followed by light exposure by a well known KrF laser stepper and development by NMD-3 (trademark of a product made by Tokyo Ohka Kogyo Co., Ltd.) to form a contact hole-forming resist pattern, where fourth interlayer insulating layer 1221 having alkali-soluble functional groups can be patterned at the same time.

After heating on a hot plate at 120° C. for 1.5 minutes, openings are formed in third interlayer insulating layer 1220 by means of both the resist pattern and fourth interlayer insulating layer 1221 as a mask, using an $O_2$ plasma gas, where the resist pattern is removed by etching at the same time, but patterned fourth interlayer insulating layer 1221 is modified into a film corresponding to a silicon oxide film through oxidation and decomposition of the organic functional group sites. The modified film is no more etched by the $O_2$ plasma gas and thus remain to act as an etching mask.

Then, the openings are washed with a cleaning solution ST-250 (trademark of a product by ACSI Co.), and then the interlayer insulating films comprising fourth interlayer insulating layer 1221 and third interlayer insulating layer 1220 as the whole are subjected to heat treatment at 400° C. for 30 minutes in a $N_2$ atmosphere at an oxygen concentration of not more than 50 ppm to conduct ultimate baking.

Gas components released from the interlayer insulating films at low temperatures and cleaning solution components remaining in the via holes can be all stripped off in the aforementioned process step, and adverse effects of poisoned via hole generation, etc. on the successive process step of forming a metallic film such as wiring, etc. can be eliminated.

Then, tungsten 1222 is filled in the connection via holes by a CVD process, and unwanted tungsten present on fourth interlayer insulating film 1221 is removed by chemical mechanical polishing (CMP), using SEMI-SPERSE® W2000 (trademark of a product made by Cabot Corp.) as a polishing agent. As a result, the surface of fourth interlayer insulating layer 1221 is to substantially polished, and thus remains to act as a polishing stopper, so that the polishing can be stopped substantially when fourth interlayer insulating layer 1221 is exposed.

Then, an aluminum alloy film is formed as an uppermost wiring layer, followed by patterning to form uppermost wiring layer 1223.

Then, SiN film 1224 (film thickness: 1,500 nm) is formed as a passivation film by a CVD process so as to enclose fourth interlayer insulating film 1221 including uppermost wiring layer 1223, and photosensitive polyimide film 1225 is formed thereon as a chip coat film, using PL-H705 (trademark of a product made by Hitachi Chemical Co., Ltd.) openings corresponding to scribe lines and bonding pads are provided on polyimide film 1225 in advance.

Finally, chips are diced one by one along the scribe lines by a well known dicing procedure to complete a semiconductor memory device.

In the memory device shown in FIG. 12, guard ring 1222 is formed in the peripheral region. That is, the guard ring is provided so that one end of the electroconductive plug provided through first insulating layer 1213, second insulating layer 1216, third insulating layer 1220, and fourth insulating layer 1221 (as formed by growth of filled tungsten) can be connected to upper electrode 1223, while other end can be connected to p-type well region 1206, whereby the memory region provided in the central region can be prevented from malfunction due to unwanted external noises.

As described above, interlayer insulating films each of which comprises an insulating film composed of a ladder silicone-based polymer material or comprises an organic insulating film and an insulating film composed of a ladder silicone-based polymer material, as formed in the same manner in Example 6, is used as interlayer insulating films for isolating semiconductor regions from one another and also for forming a plurality of wiring layers.

As a result, the interlayer capacitance can be made lower than those of inorganic insulating films so far often used. By controlling the delay in signal propagation through the wiring layers, the semiconductor memory device can be operated at a much higher speed.

EXAMPLE 12

Figure 13:
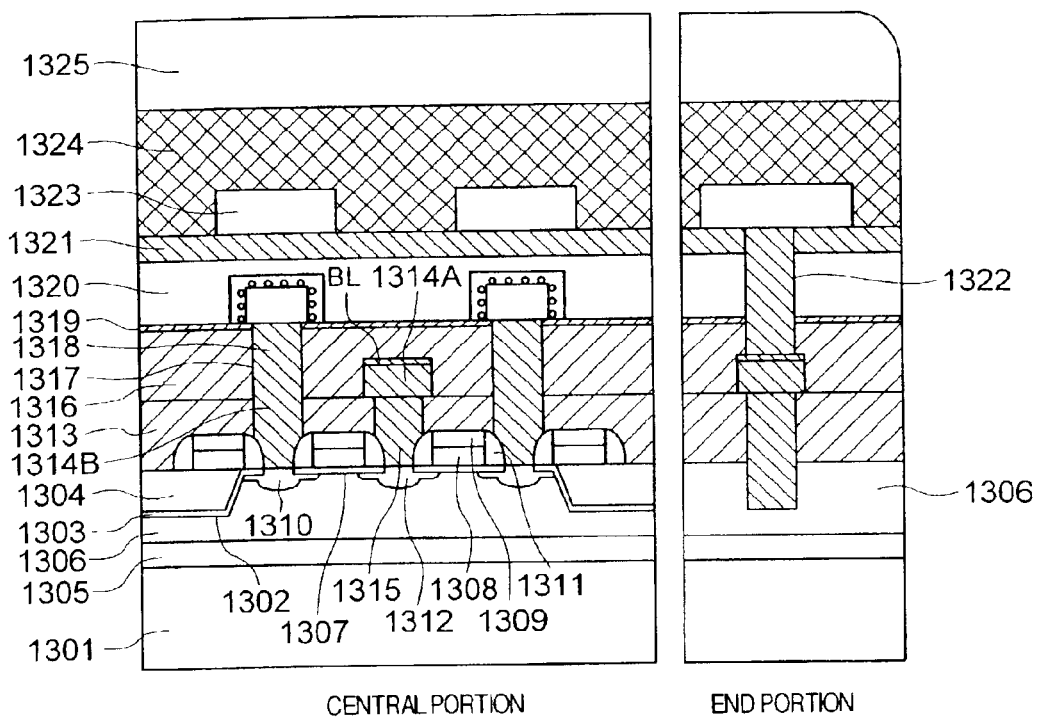
FIG. 13 shows process steps for producing a semiconductor memory device according to Example 12.

FIG. 13 is a cross-sectional view of a semiconductor memory device according to a twelfth embodiment of the present invention. Differences from Example 11 are at an organic insulating film material FLARE™ (trademark of a product made by Honeywell, Ltd.) is used for forming insulating film 1320 as a lower layer of the interlayer insulating film, and guard ring 1323 is provided in the peripheral region so that one end of the guard ring can be connected to uppermost wiring layer 1323, while other end can be filled in the p-type well region.

As in Example 11, needless to say, not only the interlayer capacitance can be made lower than those of the inorganic insulating films so far often used, but also the semiconductor memory device can be operated at a much faster speed. As is apparent from the guard ring structure, more effective protection of the memory region from external noises can be obtained than in Example 11.

EXAMPLE 13

Figure 14:
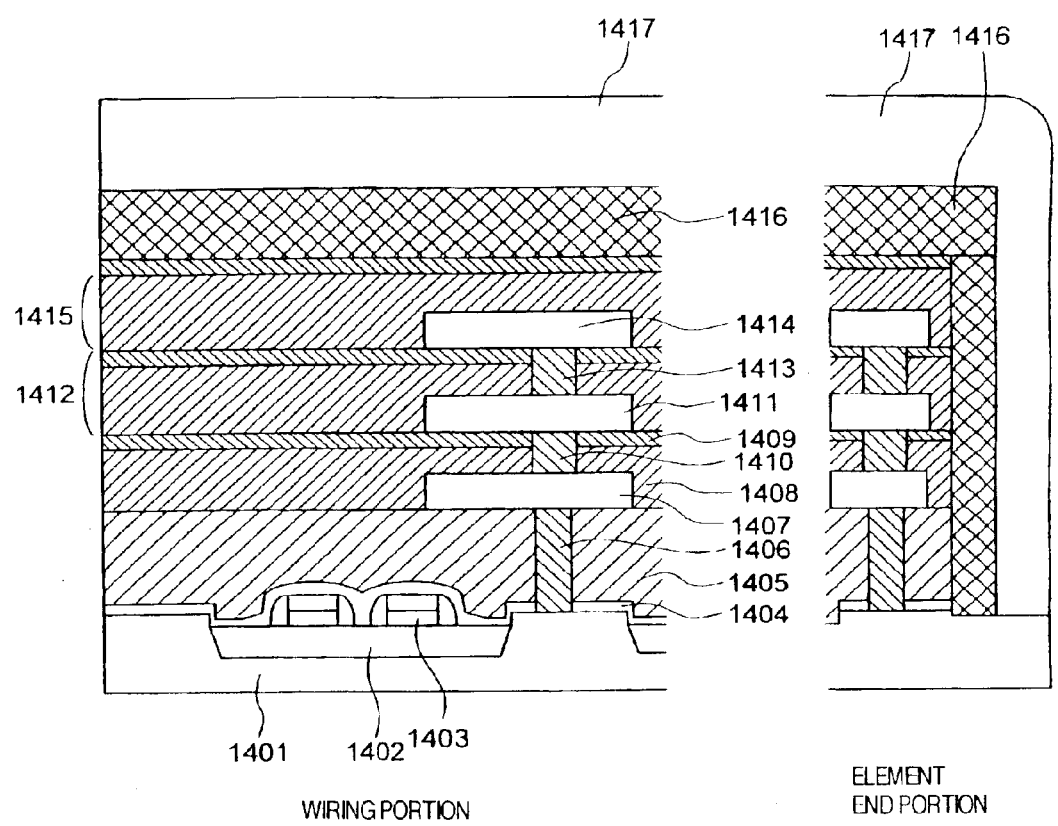
FIG. 14 shows process steps for producing a semiconductor logic device according to Example 13.

FIG. 14 is a cross-sectional view of a semiconductor logic device according to a thirteenth embodiment of the present invention.

Device isolation film region 1402 is formed on semiconductor substrate 1401 by a well known STI (Shallow Trench Isolation) process, and MOS transistor 1403 is formed in said device isolation film region 1402. Then, approximately 50 nm-thick silicon oxide film 1404 and approximately 500 nm-thick BPSG (Boron-Phosphorus Silicate Glass) film 1405 are successively formed on the surface of semiconductor substrate 1401 including MOS transistor 1403, followed by reflow annealing in a nitrogen atmosphere, e.g. at 800°–900° C.

Then, the surface of BPSG film 1405 is flattened by polishing based on chemical mechanical polishing (CMP), using e.g. silica abrasive, and then a contact hole is formed, followed by filling tungsten in the contact hole by a CVD process to form electroconductive plug 1406. Unwanted tungsten present on the surface of BPSG film 1405 is removed by a well known etching-back process.

Then, upper wiring layer 1407 composed of patterned aluminum alloy is formed on BPSG film 1405.

Then, an organic insulating film material FLARE™ (trademark of a product made by Honeywell, Ltd.) is spin coated thereon and subjected to heat treatment on a hot plate successively at 150° C., 200° C., and 250° C. each for one minute to form first insulating layer 1408 (film thickness: 500 nm) in a semi-thermosetting state.

Then, a ladder silicone-based polymer material having a molecular structure represented by the aforementioned formula (IV) [number average molecular weight (Mn)=3,060; weight average molecular weight (Mw)=4,058; γ (Mw/Mn)=1.33 (where the molecular weights are determined by liquid chromatography based on ultraviolet ray absorption as a detector)] and containing a photo-sensitizer is spin coated onto first insulating layer 1408 and subjected to heat treatment on a hot plate e.g. at 90° C. for one minute to form second insulating layer 1409 (film thickness: 100 nm).

Since both first insulating layer 1408 and second insulating layer 1409 are formed by spin coating, the surfaces are flat enough to make a device, and thus the flattening step by e.g. etching-back, CMP, etc. so far often used can be omitted in the present invention. That is, both first insulating layer 1408 and second insulating layer 1409 can be patterned in a semi-thermo-setting state.

Then, a wiring-forming resist TDUR-P080 (trademark of a product made by Tokyo Ohka Kogyo Co., Ltd.) is spin coated onto second insulating layer 1408 and heated on a hot plate e.g. at 90° C. for 1.5 minutes, followed by light exposure by a well known KrF laser stepper and development by NMD-3 (trademark of a product made by Tokyo Ohka Kogyo Co., Ltd.) to form a wiring forming resist pattern.

After heat treatment on a hot plate at 100° C. for 1.5 minutes, openings are formed in first insulating layer 1408 by second insulating layer 1409 as a mask, using an $O_2$ plasma gas, where the organic functional group sites on second insulating layer 1409 are oxidized and decomposed at the same time, thereby modifying the film into a film similar to the silicon oxide film. The modified film is no more etched by the $O_2$ plasma gas and thus remain to act as an etching mask.

For example, the following conditions are preferable for dry etching: RF power: 900 W; pressure: 1.5 Torr; substrate temperature: 35° C.; $O_2$ flow rate: 3,750 sccm.

Then, the openings are washed with a cleaning solution ST-250 (trademark of a product made by ACSI Co.) and then the interlayer insulating film comprising second insulating layer 1409 and first insulating layer 1408 is heated at 400° C. for 60 minutes, in a $N_2$ atmosphere at an oxygen concentration of not more than 10 ppm to conduct ultimate baking.

Gas components released from the interlayer insulating film at low temperatures, remaining cleaning solution components in via holes, etc. can be all stripped off in the aforementioned process step, and adverse effects of poisoned via hole generation, etc. on the successive process step of forming a metallic wiring can be eliminated.

Then, tungsten is filled in the contact holes by a CVD process to form electroconductive plugs 1410. At that time, unwanted tungsten present on second insulating layer 1409 is removed by a well known etch-back process.

Then, patterned wiring upper layer 1411 composed of aluminum alloy is formed so as to obtain electric connection with electroconductive plugs 1410.

By repeating the aforementioned process steps, three layers of interlayer insulating films are formed. Then, passivation film 1416 (film thickness: 1,500 nm) composed of a SiN film and chip coat film 1417 composed of photosensitive polyimide PL-H708 (trademark of a product made by Hitachi Chemical Co., Ltd.) are successively formed thereon by an ordinary CVD process so as to enclose the interlayer insulating films. Openings are provided in chip coat film 1417 at positions corresponding to scribe lines and bonding pads in advance, and chips are diced and separated from one another by a well known plate dicing method to complete a semiconductor logic device.

In the present invention, the interlayer capacitance can be considerably lowered, as compared with the case of conventional inorganic insulating films. Adverse effect of released gas, etc. on the successive process step of forming an electroconductive plug by filling can be eliminated by forming electroconductive plug-forming openings in the interlayer insulating films in a semi-thermosetting state and then conducting ultimate baking treatment, and thus a filling failure called poisoned via hole generation, a contact failure, and an increase in the resistance so far regarded as serious problems can be suppressed.

As in Example 8 or 9, delay in signal propagation through the wiring layers can be suppressed, and thus a semiconductor logic device of this Example can be operated at a much higher speed.

EXAMPLE 14

Figure 15:
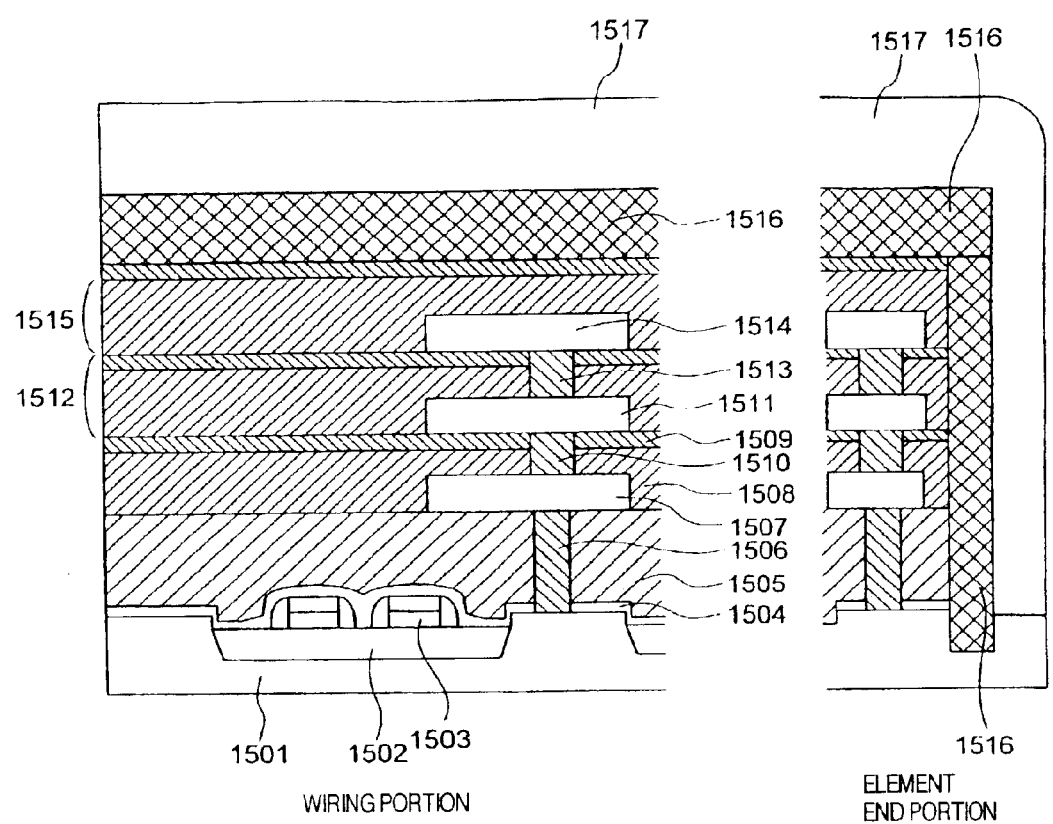
FIG. 15 shows process steps for producing a semiconductor logic device according to Example 14.

FIG. 15 is a cross-sectional view of a semiconductor logic device according to a fourteenth embodiment of the present invention. Differences from Example 13 are that organic insulating layer 1508 provided as a lower layer of the interlayer insulating film is composed of SiLK™ (trademark of a product made by Dow Chemical Co.) and silicon nitride film 1516 provided so as to enclose the interlayer insulating films is formed as embedded in semiconductor substrate 1501.

As in Example 13, the interlayer capacitance can be made smaller, as compared with the conventional case, so that not only delay in signal propagation through the wiring layers can be suppressed and the semiconductor logic device can be operated at a more higher speed, but also the operation can be assured with less influence of external noises than in Example 13 by embedding the silicon nitride film as a protective film into the semiconductor substrate.

EXAMPLE 15

Figure 16:
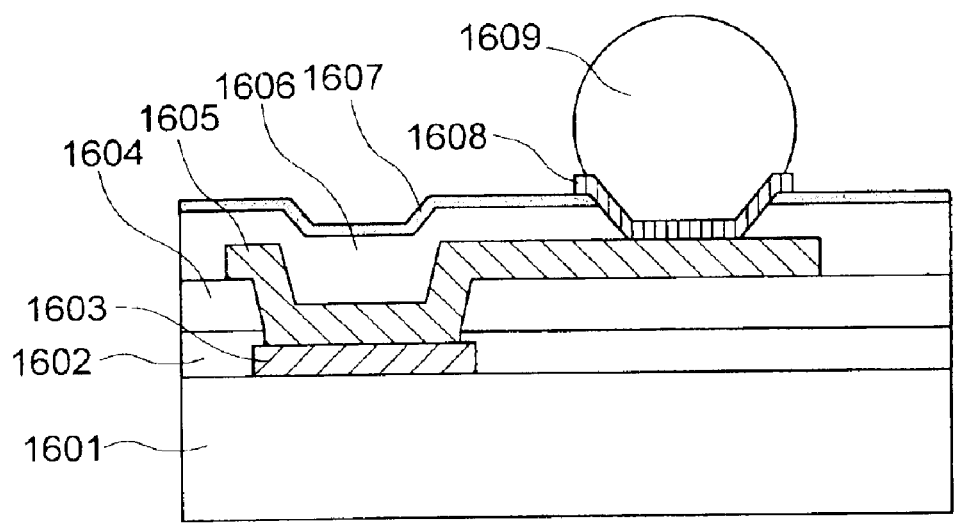
FIG. 16 shows process steps for producing a semiconductor device in a wafer level, chip-sized package structure according to Example 15.

FIG. 16 is a cross-sectional view showing a fifteenth embodiment of the present invention, where the semiconductor logic device of Example 13 is applied to a wafer level, chip-sized package structure.

In this Example, a Ni film (film thickness: approximately 50 nm) and a Cu film (film thickness; approximately 1.2 $\mu$m) are successively laid on a semiconductor device with openings as formed in polyimide chip coat film 1604 by e.g. sputtering to form rearrangement wiring layer 1605.

Then, an organic insulating film material BCB™ (trademark of a product made by Dow Chemical Co.) is spin coated onto rearrangement wiring layer 1605 and then subjected to heat treatment on a hot plate successively at 80° C., 150° C., and 200° C. each for one minute to form first insulating layer 1606 (film thickness: 3 $\mu$m) in a semi-thermosetting state.

A ladder silicone-based polymer material having a molecular structure represented by the aforementioned formula (III) [number average molecular weight (Mn)=2,032; weight average molecular weight (Mw)=2,576; (Mw/Mn)= 1.27 (where the molecular weights are determined by liquid chromatography based on ultraviolet ray absorption as a detector)] is spin coated onto first insulating layer 1606 and then subjected to heat treatment on a hot plate successively at 90° C. and 140° C. each for one minute to form second insulating layer 1607 (film thickness: 100 nm).

Then, a resist pattern (not shown in the drawing) is formed on second insulating layer 1607 by well known photo-lithography.

Successively, a desired pattern is formed on second insulating layer 1607 by means of the resist pattern as a mask in an ordinary dry etching apparatus, using a mixed gas of $CF_4$ (95%)/$O_2$ (5%).

Then, openings are formed in first insulating layer 1606 by means of both the resist pattern and patterned second insulating layer 1607, using an $O_2$ plasma gas, where the resist pattern is removed at the same time.

Then, the openings are washed with a cleaning solution ST-250 (trademark of a product made by ACSI Co.) and then the interlayer insulating film comprising second insulating layer 1607 and first insulating layer 1606 as the whole is subjected to heat treatment e.g. at 400° C. for 60 minutes in a $N_2$ atmosphere at an oxygen concentration of not more than 10 ppm to conduct ultimate thermosetting treatment.

Then, openings are formed at predetermined positions in the interlayer insulating film, and under-bump metal layers 1608 and solder bumps 1609 are successively formed in the openings by an ordinary process to electrically connect rearrangement wiring layer 1605 to solder bumps 1609 through under-bump metal layers 1608, respectively.

A semiconductor device in a wafer level, chip-sized package structure can be completed through the aforementioned process steps.

Though not shown in the drawing, external wiring, etc. are electrically connected thereto through solder bumps 1609 for propagation of various electric signals. In that case, signal propagation largely depends on the capacitance of the interlayer insulating film. The interlayer insulating film of this Example has a low relative dielectric constant, as compared with the conventional inorganic insulating films and thus the aforementioned dependence can be extremely reduced. That is, in this Example, delay is signal propagation can be much more suppressed than in the conventional case, thereby ensuring operation at a higher speed.

EXAMPLE 16

Figure 17:
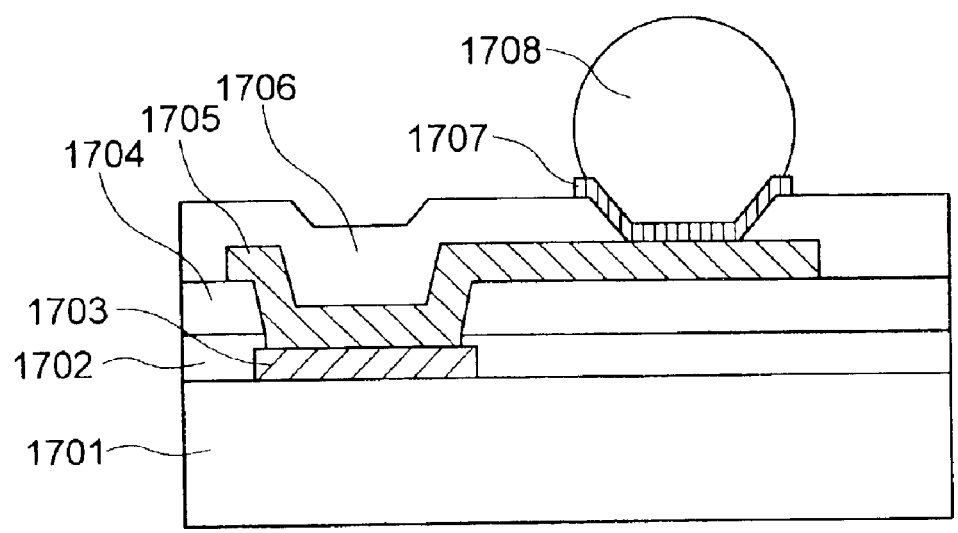
FIG. 17 shows process steps for producing a semiconductor device in a wafer level, chip-sized package structure according to Example 16.

FIG. 17 is a cross-sectional view showing a sixteenth embodiment of the present invention, where the semiconductor logic device of Example 13 is applied to a wafer level, chip-sized package structure.

Rearrangement wiring 1705 is formed on polyimide film 1704 in a semiconductor logic device, and polyimide insulating layer 1706 is further provided thereon. Under-bump metal layers 1707 for electrical connection are provided in several regions on rearrangement wiring 1705 through said polyimide insulating layer 1706, and solder bumps 1708 are formed on said under-bump metal layers 1707.

Difference from Example 15 is that the insulating film provided on rearrangement layer 1705 is composed of polyimide insulating layer 1706.

Since a semiconductor logic device capable of high speed operation can be formed on a wafer by the process of Example 13 or Example 14, a semiconductor logic package device with solder bumps can be obtained in a wafer form.

Thus, an ultimate form semiconductor logic product can be completed in a wafer form in contrast to the conventional case of providing solder bumps individually on semiconductor logic devices to form a package structure. That is, the semiconductor logic products can be produced much more efficiently than in the conventional case, thereby contributing to high speed production of the semiconductor logic products at a lower cost.

EXAMPLE 17

Figure 18:
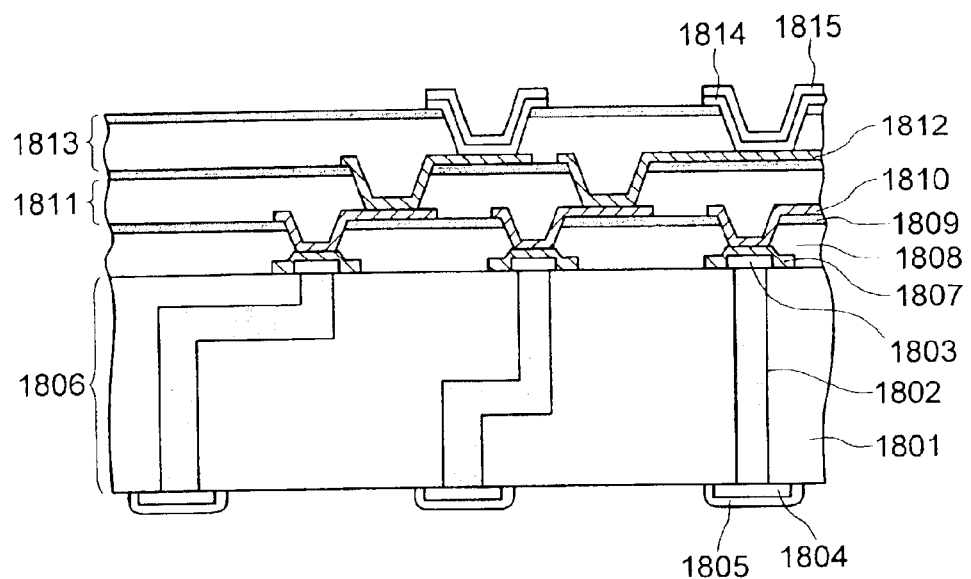
FIG. 18 is a cross-sectional view of a semiconductor device in a multi-chip module structure according to Example 17.

A multi-chip module according to a seventeenth embodiment of the present invention will be described below, referring to the cross-sectional view of FIG. 18.

Top electrodes 1803 and bottom electrodes 1804 are formed at the top and the bottom, respectively, of inner wirings 1802 in ceramic substrate 1806 by Ni plating, and Au plating layer 1805 is further formed each on said bottom electrodes 1804.

Aluminum film is formed at the top electrode 1803-formed side by vacuum vapor deposition, and first wiring layer 1807 (film thickness: 2 $\mu$m) having a desired pattern is formed by a well known photo-etching process.

Then, an organic insulating film material BCB™ (trademark of a product made by Dow Chemical Co.) is spin coated onto ceramic substrate 1806 including first wiring layer 1807 and then subjected to heat treatment successively at 80° C., 150° C., and 200° C. each for one minute to form first insulating layer 1808 (film thickness: 4 $\mu$m) in a semi-thermosetting state.

Then, a ladder silicone-based polymer material having a molecular structure represented by the aforementioned formula (IV) [number average molecular weight (Mn)=3,060; weight average molecular weight (Mw)=4,058; (Mw/Mn)= 1.33] and containing a positive type resist photo-sensitizer is spin coated onto first insulating layer 1808, and then prebaked on a hot plate at 90° C. to form second insulating layer 1809 (film thickness: 500 nm).

Then, light exposure by a well known KrF laser stepper and development by NMD-3 (trademark of a product made by Tokyo Ohka Kogyo Co., Ltd.) are carried out to pattern second insulating layer 1809 having alkali-soluble functional groups and containing the positive type resist photo-sensitizer.

After heating on a hot plate at 100° C. for one minute, openings are formed in first insulating layer 1808 by means of second insulating layer 1809 as a mask, using an $O_2$ plasma gas, where the functional group sites of second insulating layer 1809 are oxidized and decomposed, thereby modifying the film into a film corresponding to the silicon oxide film. The modified film is no more etched by the $O_2$ plasma gas and thus the second insulating layer can remain to act as an etching mask.

Then, the openings are washed with a cleaning solution ST-250 (trademark of a product made by ACSI Co.), and then the first interlayer insulating film comprising second insulating layer 1809 and first insulating layer 1808 as the whole is subjected to heat treatment at 400° C. for 60 minutes in a $N_2$ atmosphere at an oxygen concentration of not more than 10 ppm to conduct ultimate baking.

Then, second wiring layer 1810 film thickness: 2 $\mu$m) having a desired pattern is formed through the openings to electrically connect second wiring layer 1810 to first wiring layer 1807.

Thereafter, second interlayer insulating film 1811 and third interlayer insulating film 1813 are successively formed thereon in the same manner as above.

Then, Cr (0.07 $\mu$m)/Ni—Cu (0.7 $\mu$m) layer 1814 is formed in a contact hole in the third interlayer insulating film 1813 by an ordinary process, e.g. vacuum vapor deposition process, and then Ni/Au layer 1815 is formed thereon by plating to form top electrodes, thereby obtaining a multichip module substrate.

Any of the insulating films, which constitute said interlayer insulating films 1811, 1813, etc. has a lower relative dielectric constant, as compared with the conventional inorganic insulating films, and thus the interlayer capacitance can be reduced, and the delay in signal propagation of wirings can be extremely reduced.

Still furthermore, adverse effects of released gas components, etc. on the successive process step of, e.g. forming wiring can be eliminated by etching the interlayer insulating film in a semi-thermosetting state at temperatures of less than 350° C. and then conducting ultimate baking at temperatures of not less than 350° C. As a result, a filling failure called "poisoned via holes generation", a contact failure and an increase in the resistance, which have been regarded as problems of the conventional process, can be suppressed, and thus a multi-chip module of high quality can be obtained.

EXAMPLE 18

Figure 19:
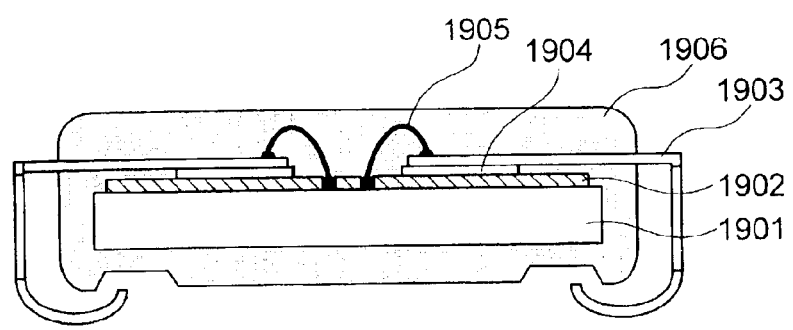
FIG. 19 is a cross-sectional view of a resin-encapsulated type semiconductor device according to Example 18.

FIG. 19 is a structural view of a resin-encapsulated memory device according to an eighteenth embodiment of the present invention.

External terminals 1903 supported on polyimide film 1904 having an adhesive layer of polyimide ether at the bottom are connected to the surface of semiconducted memory device 1901 of Example 11 or Example 12, for example, by thermal compression bonding at 400° C.

Then, bonding pads of semiconductor memory device 1901 are connected to external terminals 1903 by gold wires 1905 by an ordinary wire bonder.

Then, resin encapsulation 1906 of silica-containing expoxy-based resin is so formed to enclose semiconductor memory device 1901, external terminals 1903, gold wires 1905, etc. Resin encapsulation conditions are, e.g. molding temperature: 180° C. and molding pressure: 70 kg/cm².

Finally, parts of external terminals 1903 are bent into a desired shape to obtain a complete LOC type, resin-encapsulated product of DRAM (Dynamic Random Access Memory).

Since insulating films having a lower relative dielectric constant, composed of an organometallic polymer, are used in the interlayer insulating films of resin-encapsulated semiconductor memory device, needless to say, not only the same effects as in Examples 11 or 12 can be obtained as memory device characteristics, but also stable, high speed operation characteristics against the external circumstances can be obtained owing to the resin encapsulation.

Figure 20:
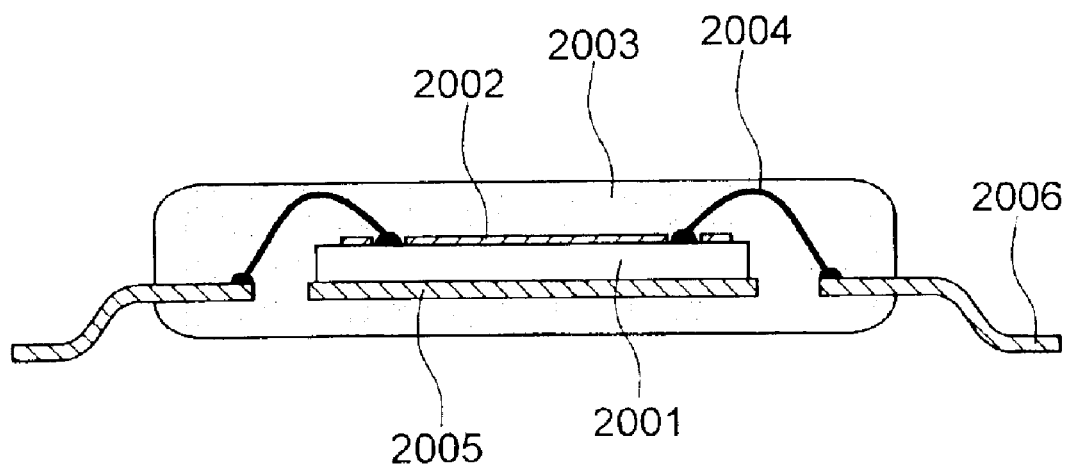
FIG. 20 is a cross-sectional view of a resin-encapsulated type semiconductor device according to Example 19.

FIG. 20 is a cross-sectional view of a resin-encapsulated semiconductor logic device according to a nineteenth embodiment of the present invention.

Semiconductor logic device 2001 of Example 13 or Example 14 is fixed to a lead frame provided in another die bonding step in advance. Then, bonding pads provided in semiconductor logic device 2001 are connected to external terminals 2005 of the lead frame by gold wires 2004 by a wire bonder.

Then, resin encapsulation 2003 of silica-containing biphenyl-based epoxy resin made by Hitachi Chemical Co., Ltd. is so formed to enclose semiconductor logic device 2001, external terminals 2005, etc. Resin encapsulation conditions are e.g., molding temperature: 180° C. and molding pressure: 70 kg/cm², which are not limitative, though.

Finally, external terminals 2006 are bent into a desired shape to obtain a complete product of resin-encapsulated logic device.

Since insulating films having a lower relative dielectric constant, composed of an organometallic polymer, are used in parts of interlayer insulating films of the resin-encapsulated semiconductor logic device, needless to say, not only the same effects as in Example 13 or Example 14 can be obtained as logic device characteristics, but also stable, high speed operation characteristics against the external circumstances can be obtained owing to the resin encapsulation.

The present invention has been described in detail above, referring to Examples, but conditions for bringing the present invention and embodiment into practice are not limited to these Examples.

INDUSTRIAL APPLICABILITY

As described above, a semiconductor device of high speed response directed to reduction in the interlayer capacitance can be simply produced by forming an interlayer insulating film of lower relative dielectric constant, composed of an organometallic polymer material by coating, as compared with the conventional inorganic insulating films formed by the CVD process.

In the present invention, adverse effects on the successive step of forming wirings can be eliminated by forming an interlayer insulating film in a semi-thermosetting state and then conducting ultimate baking.

What is claimed is:

1. A semiconductor device comprising a wiring layer and an interlayer insulating film layer, characterized in that the interlayer insulating film layer comprises a first insulating layer composed of an organic insulating film having a relative dielectric constant of 3.5 or less as a lower layer and a second insulating layer composed of an organometallic polymer having a relative dielectric constant of less than 4.0 laid thereon as an upper layer, wherein the organometallic polymer is a ladder silicone-based polymer and the ladder silicone-based polymer is a polymer material having a molecular structure represented by the following formulas (I) or (II):

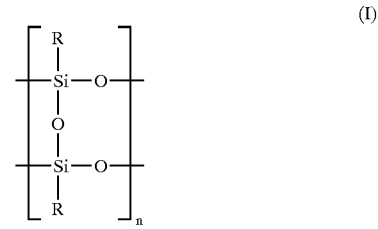

wherein R is an alkali-soluble group-containing organic group represented by the formula:

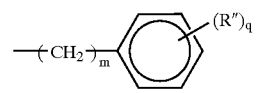

in which m is an integer of 1–3; R" is a hydroxyl group: and a is an integer of 1–3; and n is a positive number of 2 or more for the repeating unit;

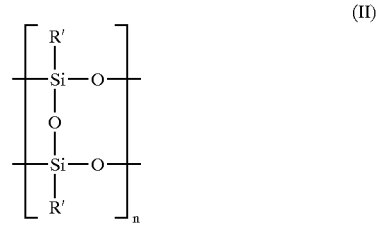

wherein R' is an organic group represented by the formula:

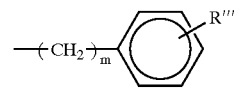

in which R'" is an alkoxy group having 1 to 3 carbon atoms; and m and n are as defined above.

2. A semiconductor device according to claim 1, characterized in that the second insulating layer has a thickness as large as or smaller than that of the first insulating layer.

3. An electronic circuit device comprising a wiring layer and an interlayer insulating film layer, characterized in that the interlayer insulating film layer comprises a first insulating layer composed of an organic insulating film having a relative dielectric constant of 3.5 or less as a lower layer and a second insulating layer composed of an organometallic polymer having a relative dielectric constant of less than 4.0 laid thereon as an upper layer, wherein the organometallic polymer is a ladder silicone-based polymer and the ladder silicone-based polymer is a polymer material having a molecular structure represented by the following formulas (I) or (II):

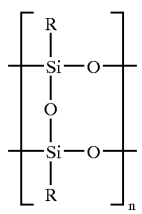   (I)

wherein R is an alkali-soluble group-containing organic group represented by the formula:

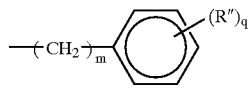

in which m is an integer of 1–3; R" is a hydroxyl group: and g is an integer of 1–3; and n is a positive number of 2 or more for the repeating unit;

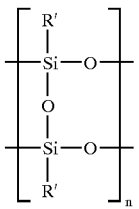   (II)

wherein R' is an organic group reoresented by the formula:

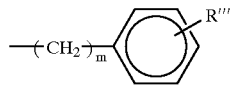

in which R'" is an alkoxy group having 1 to 3 carbon atoms; and m and n are as defined above.

4. A process for producing a semiconductor device, which comnrises a step of applying an organic insulating film material to a substrate, thereby forming a first insulating layer, a step of applying an organometallic polymer material to the first insulating layer, thereby forming a second insulating layer, a step of forming an opening-forming resist pattern on the second insulating layer, a step of forming an opening in the second insulating layer by means of the resist pattern as a mask, a step of forming an opening in the first insulating layer by means of the resist pattern and the second insulating layer as a mask by dry etching, followed by a step of removing the resist, and a step of baking the first insulating layer and the second insulating layer, wherein the organometallic polymer material is a ladder silicone-based polymer material having a molecular structure represented by the following formula (II):

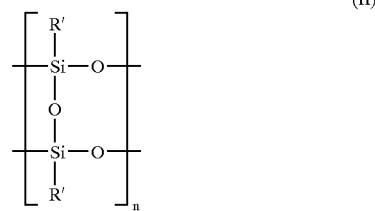   (II)

wherein R' is an organic group of the formula:

in which m is an integer of 1–3; and R'" is an alkoxy group having 1 to 3 carbon atoms; and n is a positive number of 2 or more for the repeating unit.

5. A process for producing a semiconductor device according to claim 4, characterized in that the step of forming an opening in the first insulating layer or the second insulating layer is at least one of a step of forming a contact hole and a step of forming a wiring trench.

6. A process for producing a semiconductor device according to claim 4, characterized in that after the first insulating layer is baked in a temperature range below 350° C., the opening is formed in the first insulating layer.

7. A process for producing a semiconductor device according to claim 4, characterized in that after the opening is formed in the first insulating layer, the first insulating layer is baked in a temperature range of not less than 350° C.

8. A process for producing a semiconductor device according to claim 4, characterized in that the opening is formed in the first insulating layer by dry etching, using a plasma gas containing oxygen as the main component.

9. A process for producing a semiconductor device according to claim 4, characterized in that the second insulating layer has a thickness as large as or smaller than that of the first insulating layer.

10. A process for producing a semiconductor device according to claim 4, characterized in that the second insulating layer is exposed to a plasma gas containing oxygen as the main component and then subjected to baking treatment.

11. A process for producing a semiconductor device according to claim 4, characterized in that the opening is formed in the first by dry etching by means of the second insulating layer as a mask, using a plasma gas containing oxygen as the main composed.

12. A process for producing a semiconductor device according to claim 4, characterized in that the organometallic polymer material has organic functional groups, and the organic functional groups are decomposed and removed by dry etching, using a plasma gas containing oxygen as the main component, and by heat treatment.

13. A process for producing a semiconductor device according to claim 4, characterized in that the film hardness of the second insulating layer is improved by subjecting the second insulating layer to dry etching, using a plasma gas containing oxygen as the main component, and to heat treatment.

14. A process for producing a semiconductor device, which comprises a step of applying an organic insulating film material to a substrate, thereby forming a first insulating layer, a step of applying an organometallic polymer material to the first insulating layer, thereby forming a second insulating layer, a step of forming an opening-forming resist pattern on the second insulating layer, while forming an opening in the second insulating layer, a step of forming an opening in the first insulating layer by dry etching, while removing the resist, and a step of baking the first insulating layer and the second insulating layer, wherein the organometallic polymer material is a ladder silicone-based polymer material having a molecular structure rerpresented by the following formula (I):

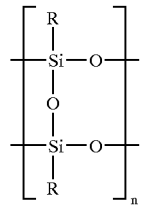

wherein R is an alkali-soluble group-containing organic group of the formula:

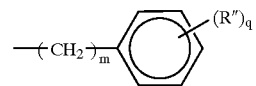

in which m is an integer of 1–3; and R' is a hydroxyl group, and q is an integer of 1–3; and n is a positive number of 2 or more for the repeating unit.

* * * * *